United States Patent
Zhang et al.

(10) Patent No.: US 10,006,804 B2
(45) Date of Patent: Jun. 26, 2018

(54) METHOD AND SYSTEM FOR SEARCHING FOR RESONANT FREQUENCY OF TRANSDUCER

(71) Applicants: REACH SURGICAL INC., Tianjin (CN); China Surgical (Shanghai) Corporation, Shanghai (CN)

(72) Inventors: Yadong Zhang, Shanghai (CN); Qizhang Chen, Shanghai (CN)

(73) Assignees: REACH SURGICAL INC., Tianjin (CN); CHINA SURGICAL (SHANGHAI) CORPORATION, Shanghai (CN)

( * ) Notice: Subject to any disclaimer, the term of this patent is extended or adjusted under 35 U.S.C. 154(b) by 69 days.

(21) Appl. No.: 14/934,904

(22) Filed: Nov. 6, 2015

(65) Prior Publication Data
US 2016/0061652 A1 Mar. 3, 2016

Related U.S. Application Data

(63) Continuation-in-part of application No. PCT/CN2014/077163, filed on May 9, 2014.

(30) Foreign Application Priority Data

May 9, 2013 (CN) .......................... 2013 1 0169366

(51) Int. Cl.
*G01H 13/00* (2006.01)
*H01L 41/09* (2006.01)
(Continued)

(52) U.S. Cl.
CPC .......... *G01H 13/00* (2013.01); *B06B 2201/54* (2013.01); *B06B 2201/55* (2013.01);
(Continued)

(58) Field of Classification Search
CPC ........ H04R 3/04; H04R 29/001; G01H 13/00; G01H 11/06; B06B 2201/55; B06B 2201/54; H01L 41/09
See application file for complete search history.

(56) References Cited

U.S. PATENT DOCUMENTS 4,275,363 A 6/1981 Mishiro et al.
4,954,960 A 9/1990 Lo et al.
(Continued)

FOREIGN PATENT DOCUMENTS

CN 1603845 A 4/2005
CN 101834473 A 9/2010
(Continued)

OTHER PUBLICATIONS

International Search Report dated Aug. 26, 2014.
EP 14 79 3984 Extended European Search Report dated Aug. 8, 2016.

*Primary Examiner* — Manish S Shah
*Assistant Examiner* — Timothy Graves
(74) *Attorney, Agent, or Firm* — Arent Fox LLP; Michael Fainberg

(57) ABSTRACT

A system for searching for a resonant frequency of a transducer, comprising: an initializing unit (11), a phase determining unit (12), an interval hopping control unit (13), a hopping interval generating unit (15), a frequency output control unit (17), a phase acquiring unit (16), and a resonant frequency obtaining unit (14). The search range of the interval for the last search can be narrowed by at least half thereof in each frequency hopping, thus allowing for reduced amount of searches.

14 Claims, 5 Drawing Sheets

(51) Int. Cl.
*H04R 3/04* (2006.01)
*H04R 29/00* (2006.01)
*G01H 11/06* (2006.01)

(52) U.S. Cl.
CPC .............. *G01H 11/06* (2013.01); *H01L 41/09* (2013.01); *H04R 3/04* (2013.01); *H04R 29/001* (2013.01)

(56) References Cited

U.S. PATENT DOCUMENTS

| | | | |
|---|---|---|---|
| 5,637,947 A * | 6/1997 | Kising | B06B 1/0253 310/316.01 |
| 5,897,569 A | 4/1999 | Kellogg | |
| 6,417,659 B1 * | 7/2002 | Schroeder | H04R 29/001 324/76.51 |
| 6,480,796 B2 | 11/2002 | Wiener | |
| 6,537,291 B2 | 3/2003 | Friedman et al. | |
| 6,588,277 B2 | 7/2003 | Giordano et al. | |
| 6,633,234 B2 | 10/2003 | Wiener et al. | |
| 6,678,621 B2 | 1/2004 | Wiener et al. | |
| 6,679,899 B2 | 1/2004 | Wiener et al. | |
| 7,074,218 B2 | 7/2006 | Washington et al. | |
| 7,244,262 B2 | 7/2007 | Wiener et al. | |
| 8,058,771 B2 | 11/2011 | Giordano et al. | |
| 8,253,303 B2 | 8/2012 | Giordano et al. | |
| 2002/0049427 A1 | 4/2002 | Wiener et al. | |
| 2002/0049555 A1 | 4/2002 | Wiener et al. | |
| 2002/0052616 A1 | 5/2002 | Wiener et al. | |
| 2002/0165680 A1 | 11/2002 | Wiener et al. | |
| 2003/0009303 A1 | 1/2003 | Wiener et al. | |
| 2003/0105480 A1 | 6/2003 | Wiener et al. | |
| 2003/0216766 A1 | 11/2003 | Wiener et al. | |
| 2004/0267252 A1 | 12/2004 | Washington et al. | |
| 2006/0217696 A1 | 9/2006 | Washington et al. | |
| 2007/0279188 A1 * | 12/2007 | Thiesen | B60C 23/0408 340/10.1 |
| 2010/0036405 A1 | 2/2010 | Giordano et al. | |
| 2010/0102672 A1 | 4/2010 | Hoffman et al. | |
| 2011/0015627 A1 | 1/2011 | Dinardo et al. | |
| 2012/0078139 A1 | 3/2012 | Aldridge et al. | |
| 2012/0123458 A1 | 5/2012 | Giordano et al. | |
| 2012/0281845 A1 | 11/2012 | Siotis | |
| 2013/0035706 A1 | 2/2013 | Giordano et al. | |
| 2013/0035707 A1 | 2/2013 | Giordano et al. | |

FOREIGN PATENT DOCUMENTS

| | | |
|---|---|---|
| CN | 101971051 A | 2/2011 |
| CN | 102647183 A | 8/2012 |
| CN | 102753982 A | 10/2012 |
| CN | 202910002 U | 5/2013 |
| WO | 20060132451 A1 | 12/2006 |

* cited by examiner

METHOD AND SYSTEM FOR SEARCHING FOR RESONANT FREQUENCY OF TRANSDUCER

This application claims priority to and is a continuation-in-part of International Application No. PCT/CN2014/077163, filed on May 9, 2014, designating the United States, and claiming the priority of Chinese Patent Application No. 201310169366.7, filed with the State Intellectual Property Office of People's Republic of China on May 9, 2013 and entitled "Method and system for searching for resonant frequency of transducer", which is hereby incorporated by reference in its entirety.

FIELD

The present invention relates to the field of transducers and particularly to a method and system for searching for a resonant frequency of a transducer.

BACKGROUND

A typical ultrasonic transducer always has a steep resonance curve with a very high Quality factor, and high mechanical amplitude and high motor efficiency will be available only if the ultrasonic transducer operates at its resonant frequency. Thus the ultrasonic transducer shall be driven with its resonant frequency signal by a drive circuit thereof.

An operating frequency of a resonating device swings back and forth in certain range, and since the frequency varies in the range predetermined by a line, the operating frequency may deviate from a real resonance point for the majority of an operating period of time, so that the device operating at a frequency other than the resonance point may tend to come with a waste of power and degraded efficiency.

In order to obtain the resonant frequency of the ultrasonic transducer, an ultrasonic energy drive system needs, for example, an ultrasonic generator, to search for the resonant frequency of the transducer and then drives the transducer with that frequency so that the transducer operates in a resonant state.

One existing way to search for the resonant frequency of the transducer currently is frequency sweep, that is, a search for the resonant frequency is made by increasing or decreasing the frequency of an energy resource progressively, but the search may be made slowly and inefficiently. For example, if the frequency sweep is performed from 50 KHz to 60 KHz, then a period of time with 10,000 determinations may be required in order to guarantee accuracy of a search result, which is inefficient.

SUMMARY

In view of the drawbacks in the prior art, an object of the invention is to provide a method and system for searching for a resonant frequency of a transducer so as to address the problems in the prior art of a slow and inefficient search for the resonant frequency of the transducer.

In order to achieve the object above and other rated objects, in an aspect, the invention provides a method for searching for a resonant frequency of a transducer, the method including: S1. obtaining a minimum operating frequency and a maximum operating frequency allowed for the transducer; S2. setting a preset driving frequency, so as to obtain a hopping-up interval formed between the maximum operating frequency and the preset driving frequency, and a hopping-down interval formed between the preset driving frequency and the minimum operating frequency; S3. obtaining a current phase and a voltage phase of the transducer operating at the preset driving frequency; determining the leading or lagging relationship between the current phase and the voltage phase; or if the current leads the voltage in phase, then hopping to the hopping-up interval, or if the current lags the voltage in phase, then hopping to the hopping-down interval; S4. obtaining a central frequency of the current hopping-up interval or the current hopping-down interval, and forming a new hopping-up interval and a new hopping-down interval between two endpoints of the current hopping-up interval or the current hopping-down interval and the corresponding central frequency; S5. operating the transducer at the central frequency; obtaining a current phase and a voltage phase of the transducer operating at the central frequency in the current hopping-up interval or the current hopping-down interval; determining the leading or lagging relationship between the current phase and the voltage phase; or if the current leads the voltage in phase, then hopping to the hopping-up interval, or if the current lags the voltage in phase, then hopping to the hopping-down interval; and S6. repeating the operation S4 and the operation S5 until the current of the transducer is in phase with the voltage thereof; and obtaining a frequency of the transducer with the current being in phase with the voltage as the resonant frequency.

Preferably, in the operation S2, the preset driving frequency lies in the middle between the minimum operating frequency and the maximum operating frequency.

Preferably, in the operation S4, the new hopping-up interval is formed between the central frequency and the higher one of the two endpoints; and the new hopping-down interval is formed between the central frequency and the lower one of the two endpoints.

In another aspect, the invention provides a system for searching for a resonant frequency of a transducer, the system including: an initializing unit configured to obtain a minimum operating frequency and a maximum operating frequency allowed for the transducer, to set a preset driving frequency, to form a hopping-up interval between the maximum operating frequency and the preset driving frequency, and to form a hopping-down interval between the preset driving frequency and the minimum operating frequency, and to obtain a current phase and a voltage phase of the transducer operating at the preset driving frequency; a phase determining unit, connected with the initializing unit, configured to determine the leading or lagging relationship between the current phase and the voltage phase, if the current leads the voltage in phase, to output a first result, if the current lags the voltage in phase, to output a second result, or if the current phase is equal to the voltage phase, to output a third result; an interval hopping control unit, connected with the phase determining unit, configured to make a hop to the hopping-up interval upon reception of the first result output by the phase determining unit, or to make a hop to the hopping-down interval upon reception of the second result output by the phase determining unit; a hopping interval generating unit, connected with the interval hopping control unit, configured to obtain a central frequency of the current hopping-up interval or the current hopping-down interval, and to form a new hopping-up interval and a new hopping-down interval between two endpoints of the current hopping-up interval or the current hopping-down interval and the corresponding central frequency; a frequency output control unit, connected with the hopping interval generating unit and the transducer, configured to excite the transducer with the central frequency of the current hopping-up interval or the hopping-down interval so that the transducer operates at the central frequency; a phase acquiring unit, connected with the phase determining unit and the transducer, configured to obtain a current phase and a voltage phase of the transducer operating at the central frequency of the current hopping-up interval or the current hopping-down interval; and a resonant frequency obtaining unit, connected with the phase determining unit, configured to obtain a frequency of the transducer with the current being in phase with the voltage as the resonant frequency upon reception of the third result output by the phase determining unit.

Preferably the system further includes an input unit configured to input the minimum operating frequency, the maximum operating frequency, and the preset driving frequency to the initializing unit.

Preferably the system further includes a display unit configured to display the resonant frequency obtained by the resonant frequency obtaining unit.

Preferably the initializing unit includes: a frequency obtaining sub-unit configured to obtain the minimum operating frequency and the maximum operating frequency allowed for the transducer; a driving frequency presetting sub-unit configured to set a preset driving frequency; an initial hopping interval generating sub-unit, connected with the frequency obtaining sub-unit and the driving frequency presetting sub-unit, configured to form the hopping-up interval between the maximum operating frequency and the preset driving frequency, and to form the hopping-down interval between the preset driving frequency and the minimum operating frequency; a preset frequency output sub-unit configured to excite the transducer with the preset driving frequency so that the transducer operates at the preset driving frequency; and an initial phase acquiring sub-unit configured to obtain the current phase and the voltage phase of the transducer operating at the preset driving frequency.

Preferably the preset driving frequency lies in the middle between the minimum operating frequency and the maximum operating frequency.

Preferably in the hopping interval generating unit, the new hopping-up interval is formed between the central frequency and the higher one of the two endpoints; and the new hopping-down interval is formed between the central frequency and the lower one of the two endpoints.

In another aspect, the invention provides a method for searching for a resonant frequency of a transducer, the method including:

S1. obtaining a minimum operating frequency and a maximum operating frequency allowed for the transducer;

S2. setting a preset driving frequency, forming a hopping-up interval between the maximum operating frequency and the preset driving frequency, and forming a hopping-down interval between the preset driving frequency and the minimum operating frequency;

S3. obtaining a current phase and a voltage phase of the transducer operating at the preset driving frequency; and when the difference in phase between the current and the voltage does not lie in a pre-defined range, if the current leads the voltage in phase, then hopping to the hopping-up interval, or if the current lags the voltage in phase, then hopping to the hopping-down interval, and proceeding with the operation S4; when the difference in phase between the current and the voltage lies in the pre-defined range, proceeding with the operation S6;

S4. setting a new preset driving frequency in the current hopping-up interval or the current hopping-down interval, and forming a new hopping-up interval and a new hopping-down interval between two endpoints of the current hopping-up interval or the current hopping-down interval and the corresponding new preset driving frequency;

S5. operating the transducer at the new preset driving frequency; obtaining a current phase and a voltage phase of the transducer operating at the new preset driving frequency in the current hopping-up interval or the current hopping-down interval; and when the difference in phase between the current and the voltage does not lie in the pre-defined range, if the current leads the voltage in phase, then hopping to the hopping-up interval, or if the current lags the voltage in phase, then hopping to the hopping-down interval, and going back to the operation S4; when the difference in phase between the current and the voltage lies in the pre-defined range, proceeding with the operation S6; and S6. obtaining a frequency of the transducer with the difference in phase between the current and the voltage lying in the pre-defined range as the resonant frequency.

Preferably in the operation S2, the preset driving frequency lies at the middle between the minimum operating frequency and the maximum operating frequency.

Preferably, in the operation S4, the new hopping-up interval is formed between the new preset driving frequency and the higher one of the two endpoints; and the new hopping-down interval is formed between the new preset driving frequency and the lower one of the two endpoints.

Preferably in the operation S4, the new preset driving frequency is a central frequency of the current hopping-up interval or the current hopping-down interval.

Furthermore, there is only a value of 0 in the pre-defined range.

In another aspect, the invention provides a system for searching for a resonant frequency of a transducer, the system including:

an initializing unit configured to obtain a minimum operating frequency and a maximum operating frequency allowed for the transducer; to set a preset driving frequency, to form a hopping-up interval between the maximum operating frequency and the preset driving frequency, and to form a hopping-down interval between the preset driving frequency and the minimum operating frequency; and to obtain a current phase and a voltage phase of the transducer operating at the preset driving frequency;

a phase determining unit, connected with the initializing unit, configured, when the difference in phase between the current and the voltage does not lie in a pre-defined range, if the current leads the voltage in phase, to output a first result, or if the current lags the voltage in phase, to output a second result; when the difference in phase between the current and the voltage lies in the pre-defined range, to output a third result;

an interval hopping control unit, connected with the phase determining unit, configured to make a hop to the hopping-up interval upon reception of the first result output by the phase determining unit, or to make a hop to the hopping-down interval upon reception of the second result output by the phase determining unit;

a hopping interval generating unit, connected with the interval hopping control unit, configured to set a new preset driving frequency in the current hopping-up interval or the current hopping-down interval, and to form a new hopping-up interval and a new hopping-down interval between two endpoints of the current hopping-up interval or the current hopping-down interval and the corresponding new preset driving frequency;

a frequency output control unit, connected with the hopping interval generating unit and the transducer, configured to excite the transducer with the new preset driving frequency in the current hopping-up interval or the hopping-down interval so that the transducer operates at the new preset driving frequency;

a phase acquiring unit, connected with the phase determining unit and the transducer, configured to obtain a current phase and a voltage phase of the transducer operating at the new preset driving frequency in the current hopping-up interval or the current hopping-down interval; and a resonant frequency obtaining unit, connected with the phase determining unit, configured to obtain a frequency of the transducer with the difference in phase between the current and the voltage lying in the pre-defined range as the resonant frequency upon reception of the third result output by the phase determining unit.

Preferably the system further includes an input unit configured to input the minimum operating frequency, the maximum operating frequency, and the preset driving frequency to the initializing unit.

Preferably the system further includes a display unit configured to display the resonant frequency obtained by the resonant frequency obtaining unit.

Preferably the initializing unit includes: a frequency obtaining sub-unit configured to obtain the minimum operating frequency and the maximum operating frequency allowed for the transducer; a driving frequency presetting sub-unit configured to set a preset driving frequency; an initial hopping interval generating sub-unit, connected with the frequency obtaining sub-unit and the driving frequency presetting sub-unit, configured to form the hopping-up interval between the maximum operating frequency and the preset driving frequency, and to form the hopping-down interval between the preset driving frequency and the minimum operating frequency; a preset frequency output sub-unit configured to excite the transducer with the preset driving frequency so that the transducer operates at the preset driving frequency; and an initial phase acquiring sub-unit configured to obtain the current phase and the voltage phase of the transducer operating at the preset driving frequency.

Preferably the preset driving frequency lies at the middle between the minimum operating frequency and the maximum operating frequency.

Preferably, in the hopping interval generating unit, the new hopping-up interval is formed between the new preset driving frequency and the higher one of the two endpoints; and the new hopping-down interval is formed between the new preset driving frequency and the lower one of the two endpoints.

Preferably the new preset driving frequency is a central frequency of the current hopping-up interval or the current hopping-down interval.

Furthermore there is only a value of 0 in the pre-defined range.

In another aspect, the invention provides a method for searching for a resonant frequency of a transducer, the method including:

S1. obtaining a minimum operating frequency and a maximum operating frequency allowed for the transducer;

S2. setting a preset driving frequency, forming a hopping-up interval between the maximum operating frequency and the preset driving frequency, and forming a hopping-down interval between the preset driving frequency and the minimum operating frequency;

S3. obtaining a current phase and a voltage phase of the transducer operating at the preset driving frequency; and when the amount of all the preset driving frequencies does not reach a preset number and the difference in phase between the current and the voltage does not lie in a pre-defined range, or when the amount of all the preset driving frequencies does not reach the preset number and the amplitude of the current does not reach a pre-defined amplitude, if the current leads the voltage in phase, then hopping to the hopping-up interval, or if the current lags the voltage in phase, then hopping to the hopping-down interval, and proceeding with the operation S4; when the amount of all the preset driving frequencies reaches the preset number, or when the difference in phase between the current and the voltage lies in the pre-defined range, and the amplitude of the current reaches the pre-defined amplitude, proceeding with the operation S6;

S4. setting a new preset driving frequency in the current hopping-up interval or the current hopping-down interval, and creating a new hopping-up interval and a new hopping-down interval between two endpoints of the current hopping-up interval or the current hopping-down interval and the corresponding new preset driving frequency;

S5. operating the transducer at the new preset driving frequency; obtaining a current phase and a voltage phase of the transducer operating at the new preset driving frequency in the current hopping-up interval or the current hopping-down interval; and when the amount of all the preset driving frequencies does not reach the preset number and the difference in phase between the current and the voltage does not lie in the pre-defined range, or when the amount of all the preset driving frequencies does not reach the preset number and the amplitude of the current does not reach the pre-defined amplitude, if the current leads the voltage in phase, then hopping to the hopping-up interval, or if the current lags the voltage in phase, then hopping to the hopping-down interval, and going back to the operation S4; when the amount of all the preset driving frequencies reaches the preset number, or when the difference in phase between the current and the voltage lies in the pre-defined range, and the amplitude of the current reaches the pre-defined amplitude, proceeding with the operation S6; and S6. obtaining a frequency of the transducer with the largest amplitude of current as the resonant frequency when the amount of all the preset driving frequencies reaches the preset number; and obtaining as the resonant frequency a frequency of the transducer with the difference in phase between the current and the voltage lying in the pre-defined range, and the amplitude of the current reaching the pre-defined amplitude when the difference in phase between the current and the voltage lies in the pre-defined range, and the amplitude of the current reaches the pre-defined amplitude.

Preferably in the operation S2, the preset driving frequency lies at the middle between the minimum operating frequency and the maximum operating frequency.

Preferably, in the operation S4, the new hopping-up interval is formed between the new preset driving frequency and the higher one of the two endpoints; and the new hopping-down interval is formed between the new preset driving frequency and the lower one of the two endpoints.

Preferably in the operation S4, the new preset driving frequency is a central frequency of the current hopping-up interval or the current hopping-down interval.

Furthermore there is only a value of 0 in the pre-defined range.

In another aspect, the invention provides a system for searching for a resonant frequency of a transducer, the system including:

an initializing unit configured to obtain a minimum operating frequency and a maximum operating frequency allowed for the transducer, to set a preset driving frequency, to form a hopping-up interval between the maximum operating frequency and the preset driving frequency, and to form a hopping-down interval between the preset driving frequency and the minimum operating frequency; and to obtain a current phase and a voltage phase of the transducer operating at the preset driving frequency;

a phase determining unit, connected with the initializing unit, configured, when the amount of all the preset driving frequencies does not reach a preset number and the difference in phase between the current and the voltage does not lie in a pre-defined range, or when the amount of all the preset driving frequencies does not reach the preset number and the amplitude of the current does not reach a pre-defined amplitude, if the current leads the voltage in phase, to output a first result, or if the current lags the voltage in phase, to output a second result; when the amount of all the preset driving frequencies reaches the preset number, or when the difference in phase between the current and the voltage lies in the pre-defined range, and the amplitude of the current reaches the pre-defined amplitude, to output a third result;

an interval hopping control unit, connected with the phase determining unit, configured to make a hop to the hopping-up interval upon reception of the first result output by the phase determining unit, and to make a hop to the hopping-down interval upon reception of the second result output by the phase determining unit;

a hopping interval generating unit, connected with the interval hopping control unit, configured to set a new preset driving frequency in the current hopping-up interval or the current hopping-down interval, and to form a new hopping-up interval and a new hopping-down interval between two endpoints of the current hopping-up interval or the current hopping-down interval and the corresponding new preset driving frequency;

a frequency output control unit, connected with the hopping interval generating unit and the transducer, configured to excite the transducer with the new preset driving frequency in the current hopping-up interval or the hopping-down interval so that the transducer operates at the new preset driving frequency;

a phase acquiring unit, connected with the phase determining unit and the transducer, configured to obtain a current phase and a voltage phase of the transducer operating at the new preset driving frequency in the current hopping-up interval or the current hopping-down interval; and a resonant frequency obtaining unit, connected with the phase determining unit, configured to obtain a frequency of the transducer with the amplitude of the current being the largest as the resonant frequency upon reception of the third result output by the phase determining unit when the amount of all the preset driving frequencies reaches the preset number; and to obtain a frequency of the transducer with the difference in phase between the current and the voltage lying in the pre-defined range, and the amplitude of the current reaching the pre-defined amplitude upon reception of the third result output by the phase determining unit when the difference in phase between the current and the voltage lies in the pre-defined range, and the amplitude of the current reaches the pre-defined amplitude.

Preferably the system further includes an input unit configured to input the minimum operating frequency, the maximum operating frequency, and the preset driving frequency to the initializing unit.

Preferably the system further includes a display unit configured to display the resonant frequency obtained by the resonant frequency obtaining unit.

Preferably the initializing unit includes:

a frequency obtaining sub-unit configured to obtain the minimum operating frequency and the maximum operating frequency allowed for the transducer;

a driving frequency presetting sub-unit configured to preset a preset driving frequency;

an initial hopping interval generating sub-unit, connected with the frequency obtaining sub-unit and the driving frequency presetting sub-unit, configured to form the hopping-up interval between the maximum operating frequency and the preset driving frequency, and to form the hopping-down interval between the preset driving frequency and the minimum operating frequency;

a preset frequency output sub-unit configured to excite the transducer with preset driving frequency so that the transducer operates at the preset driving frequency; and an initial phase acquiring sub-unit configured to obtain the current phase and the voltage phase of the transducer operating at the preset driving frequency.

Preferably the preset driving frequency lies at the middle between the minimum operating frequency and the maximum operating frequency.

Preferably, in the hopping interval generating unit, the new hopping-up interval is formed between the new preset driving frequency and the higher one of the two endpoints; and the new hopping-down interval is formed between the new preset driving frequency and the lower one of the two endpoints.

Preferably the new preset driving frequency is a central frequency of the current hopping-up interval or the current hopping-down interval.

Furthermore there is only a value of 0 in the pre-defined range.

As described above, a method and system for searching for a resonant frequency of a transducer according to the invention have the following advantageous effects:

1. With the search method according to the invention between the frequency hopping, the number of searches can be greatly lowered to the greatest extent from original 10,000 searches down to 14 searches, so the search efficiency can be improved by a factor of 99.9% to thereby greatly shorten the period of time for awaiting the detection for the resonant frequency of the transducer.

2. The invention can greatly shorten the search period of time and also shorten the operating period of time and lower the rise in temperature of the transducer to thereby improve the accuracy of the search for the resonant frequency.

3. The invention can lower in effect the number of times that the transducer operates uselessly, improve the utilization ratio and lifetime of the transducer, and also lower the cost thereof in use.

4. In the invention, there is such a short search period of time that the function of detecting in real time the operating state of the transducer can be added.

REFERENCE NUMERALS

Figure 1:
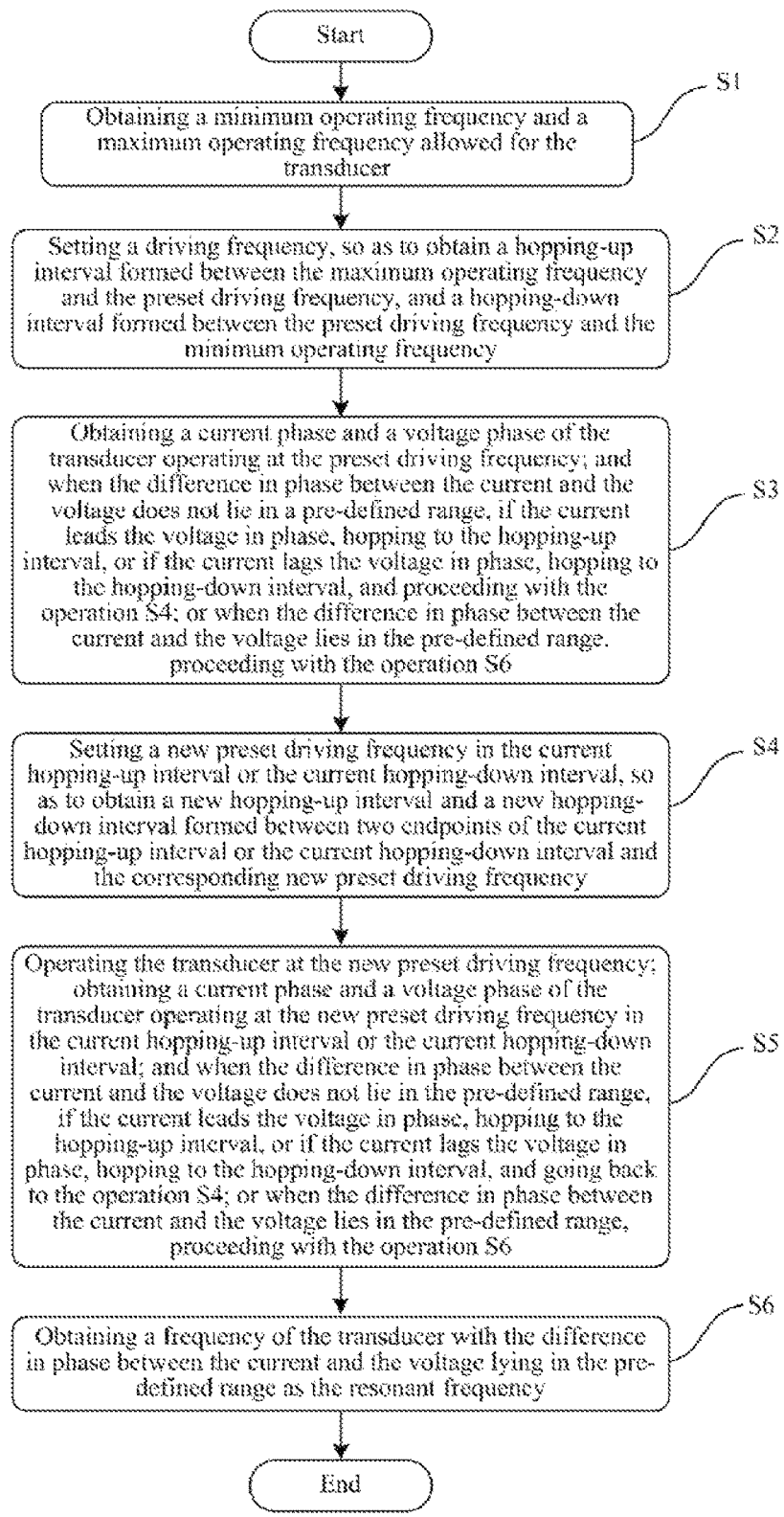
FIG. 1 illustrates a schematic flow chart of a method for searching for a resonant frequency of a transducer according to a first embodiment of the invention.

1 System for searching for a resonant frequency of a transducer
11 Initializing unit
11 Frequency obtaining sub-unit
112 Driving frequency presetting sub-unit
113 Initial hopping interval generating sub-unit
114 Preset frequency output sub-unit
115 Initial phase acquiring sub-unit
12 Phase determining unit
13 Interval hopping control unit
14 Resonant frequency obtaining unit
15 Hopping interval generating unit
16 Phase acquiring unit
17 Frequency output control unit
18 Input unit
19 Display unit
S1 to S6 Operations

DETAILED DESCRIPTION OF THE EMBODIMENTS

Embodiments of the invention will be described below in connection with particular examples, and those skilled in the art can readily appreciate the other advantages and effects of the invention from the disclosure of the invention. The invention can be practiced or for application in other different particular embodiments, and the respective details in this specification can be modified or varied variously from different perspectives or for different applications without departing from the spirit of the invention.

One existing way to search for the resonant frequency of the transducer currently is frequency sweep, that is, a search for the resonant frequency is made by increasing or decreasing the frequency of an energy resource progressively, however, it takes a long time which is inefficient. For example, if the frequency sweep is performed from 50 KHz to 60 KHz, then a period of time with 10,000 determinations may be required in order to guarantee accuracy of a search result, which is inefficient.

Thus, one of the objectives of the invention is to provide a method and system for searching for a resonant frequency of a transducer so as to address the problems of prior art. Principles and embodiments of a method and system for searching for a resonant frequency of a transducer according to the invention will be described below in details to enable those skilled in the art to appreciate the method and system for searching for a resonant frequency of a transducer according to the invention without any inventive effort.

First Embodiment

Referring to FIG. 1, it is illustrated a schematic flow chart of a method for searching for a resonant frequency of a transducer according to the invention. As illustrated in FIG. 1, a method for searching for a resonant frequency of a transducer according to the invention includes the following operations:

S1. obtaining a minimum operating frequency and a maximum operating frequency allowed for the transducer;

S2. setting a driving frequency, so as to obtain a hopping-up interval formed between the maximum operating frequency and the preset driving frequency, and a hopping-down interval formed between the preset driving frequency and the minimum operating frequency;

S3. obtaining a current phase and a voltage phase of the transducer operating at the preset driving frequency; and when the difference in phase between the current and the voltage does not lie in a pre-defined range, if the current leads the voltage in phase, hopping to the hopping-up interval; or if the current lags the voltage in phase, hopping to the hopping-down interval, and proceeding with operation S4; or when the difference in phase between the current and the voltage lies in the pre-defined range, proceeding with the operation S6;

S4. setting a new preset driving frequency in the current hopping-up interval or the current hopping-down interval, so as to obtain a new hopping-up interval and a new hopping-down interval formed between two endpoints of the current hopping-up interval or the current hopping-down interval and the corresponding new preset driving frequency;

S5. operating the transducer at the new preset driving frequency; obtaining a current phase and a voltage phase of the transducer operating at the new preset driving frequency in the current hopping-up interval or the current hopping-down interval; and when the difference in phase between the current and the voltage does not lie in the pre-defined range, if the current leads the voltage in phase, hopping to the hopping-up interval, or if the current lags the voltage in phase, hopping to the hopping-down interval; going back to the operation S4; or when the difference in phase between the current and the voltage lies in the pre-defined range, proceeding with operation S6; and S6. obtaining a frequency of the transducer with the difference in phase between the current and the voltage lying in the pre-defined range as the resonant frequency.

The respective operations mentioned above will be described below in details, respectively.

Firstly the operation S1 is performed to obtain a minimum operating frequency and a maximum operating frequency allowed for the transducer, where the minimum operating frequency and the maximum operating frequency allowed for the transducer can be known from a description of a specification or a related technical document for the transducer being shipped from a manufactory. Typically there are substantially the same minimum operating frequency and maximum operating frequency specified and required for a batch of transducers being shipped from the manufactory.

Next the operation S2 is performed after obtaining the minimum operating frequency and the maximum operating frequency allowed for the transducer.

The operation S2 is performed to preset a driving frequency, so as to obtain a hopping-up interval formed between the maximum operating frequency and the preset driving frequency, and form a hopping-down interval formed between the preset driving frequency and the minimum operating frequency.

If the resonant frequency of a transducer is unknown, then the driving frequency can be preset empirically by collecting frequencies for processing. This preset driving frequency shall lie between the minimum operating frequency and the maximum operating frequency allowed for the transducer.

More specifically, the preset driving frequency can further lie in or around the middle between the minimum operating frequency and the maximum operating frequency allowed for the transducer in the operation S2.

The two intervals are obtained based on the preset driving frequency as a boundary after the minimum operating frequency and the maximum operating frequency allowed for the transducer, and the preset driving frequency are obtained. Particularly the hopping-up interval is formed between the maximum operating frequency and the preset driving frequency, that is, two endpoints of the hopping-up interval are the maximum operating frequency and the preset driving frequency respectively; and the hopping-down interval is formed between the preset driving frequency and the minimum operating frequency, that is, two endpoints of the hopping-down interval are the preset driving frequency and the minimum operating frequency respectively. Next the operation S3 is performed after the hopping-up interval and the hopping-down interval are determined.

The operation S3 is performed to obtain a current phase and a voltage phase of the transducer operating at the preset driving frequency; and when the difference in phase between the current and the voltage does not lie in a pre-defined range, if the current leads the voltage in phase, to hop to the hopping-up interval, or if the current lags the voltage in phase, to hop to the hopping-down interval, and to proceed with the operation S4; or when the difference in phase between the current and the voltage lies in the pre-defined range, to proceed with the operation S6.

Particularly in this embodiment, exciting the transducer with the preset driving frequency, so as to acquire or measure the current phase and the voltage phase of the transducer operating at the preset driving frequency, when the difference in phase between the current and the voltage does not lie in the pre-defined range, if the current leads the voltage in phase, meaning there is a capacitive load, indicating that the current frequency of the transducer is lower, the resonant frequency shall be higher than the current frequency, so further searching should be performed within the hopping-up interval (between the maximum operating frequency and the preset driving frequency); and on the contrary, if the voltage leads the current in phase, meaning there is an inductive load, indicating that the current frequency of the transducer is higher, and the resonant frequency shall be lower than the current frequency, so further searching shall be performed within the hopping-down interval (between the minimum operating frequency and the preset driving frequency). Apparently the searching range can be halved due to the operation S3 in this search method.

The operation S4 is performed to set a new preset driving frequency in the current hopping-up interval or the current hopping-down interval, so as to obtain a new hopping-up interval and a new hopping-down interval formed between two endpoints of the current hopping-up interval or the current hopping-down interval and the corresponding new preset driving frequency. In fact, further searching for resonant frequency will be performed within the current hopping-up interval or the current hopping-down interval in the operation S4.

a central frequency of the current hopping-up interval or the current hopping-down interval can be obtained as the new preset driving frequency, and the new hopping-up interval and the new hopping-down interval can be formed between the two endpoints of the current hopping-up interval or the current hopping-down interval and the corresponding central frequency; alternatively, any frequency can be obtained in the current hopping-up interval or the current hopping-down interval as the new preset driving frequency, and the new hopping-up interval and the new hopping-down interval can be formed, and preferably the new preset driving frequency can be preset as a function of the difference in phase between the current and the voltage currently of the transducer so that the new preset driving frequency is preset farther from the current preset driving frequency if the difference in phase between the current and the voltage of the transducer is larger, and the new preset driving frequency is preset closer to the current preset driving frequency if the difference in phase between the current and the voltage of the transducer is smaller.

Particularly, if the hop is made to the hopping-up interval to further search for the resonant frequency in the operation S3, then in the operation S4, a central frequency of the hopping-up interval can be obtained as the new preset driving frequency, and the new hopping-up interval and the new hopping-down interval can be formed between the two endpoints of the current hopping-up interval (i.e., the maximum operating frequency and the original preset driving frequency) and the central frequency; alternatively, another frequency than the central frequency of the hopping-up interval can be obtained as the new preset driving frequency, and the new hopping-up interval and the new hopping-down interval can be formed between the two endpoints of the current hopping-up interval and the another frequency than the central frequency.

Still furthermore, if the hop is made to the hopping-up interval to further search for the resonant frequency in the operation S3, then in the operation S4, the new hopping-up interval is formed between the new preset driving frequency and the higher one of the two endpoints of the original hopping-up interval, that is, two endpoints of the new hopping-up interval are the maximum operating frequency and the new preset driving frequency respectively; and the new hopping-down interval is formed between the new preset driving frequency and the lower one of the two endpoints, that is, two endpoints of the new hopping-down interval are the original preset driving frequency and the new preset driving frequency respectively.

Correspondingly, if the hop is made to the hopping-down interval to further search for the resonant frequency in the operation S3, then in the operation S4, a central frequency of the hopping-down interval can be obtained as the new preset driving frequency, and the new hopping-up interval and the new hopping-down interval can be formed between the two endpoints of the current hopping-down interval (i.e., the minimum operating frequency and the original preset driving frequency) and the central frequency; alternatively, another frequency than the central frequency of the hopping-down interval can be obtained as the new preset driving frequency, and the new hopping-up interval and the new hopping-down interval can be formed between the two endpoints of the current hopping-down interval and the another frequency than the central frequency.

Still furthermore, if the hop is made to the hopping-down interval to further search for the resonant frequency in the operation S3, then in the operation S4, the new hopping-up interval is formed between the new preset driving frequency and the higher one of the two endpoints of the original hopping-down interval, that is, two endpoints of the new hopping-up interval are the original preset driving frequency and the new preset driving frequency respectively; and the new hopping-down interval is formed between the new preset driving frequency and the lower one of the two endpoints, that is, two endpoints of the new hopping-down interval are the new preset driving frequency and the minimum operating frequency respectively.

Next the operation S5 is performed after the new hopping-up interval and the new hopping-down interval are determined.

The operation S5 is performed to operate the transducer at the new preset driving frequency; to obtain a current phase and a voltage phase of the transducer operating at the new preset driving frequency in the current hopping-up interval or the current hopping-down interval; and when the difference in phase between the current and the voltage does not lie in the pre-defined range, if the current leads the voltage in phase, to hop to the hopping-up interval, or if the current lags the voltage in phase, to hop to the hopping-down interval, and to go back to the operation S4; or when the difference in phase between the current and the voltage lies in the pre-defined range, to proceed with the operation S6.

In fact, the frequency hopping in the operation S5 is equivalent to that in the operation S3.

Particularly in this embodiment, after the new hopping-up interval and the new hopping-down interval are determined, the current phase and the voltage phase of the transducer operating at the new preset driving frequency in the current hopping-up interval or the current hopping-down interval are measured and obtained, and when the difference in phase between the current and the voltage does not lie in the pre-defined range, if the current leads the voltage in phase, then there is a capacitive load, which indicates that the current frequency of the transducer is lower, and the resonant frequency shall be higher than the current frequency, so further searching shall be performed within the new hopping-up interval (between the maximum operating frequency and the new preset driving frequency or between the original preset driving frequency and the new preset driving frequency), if the voltage leads the current in phase, then there is an inductive load, which indicates that the current frequency of the transducer is higher, and the resonant frequency shall be lower than the current frequency, so further searching shall be performed within the new hopping-down interval (between the original preset driving frequency and the new preset driving frequency or between the new preset driving frequency and the minimum operating frequency). Apparently the search range can be further narrowed due to the operation S5 in this search method, and the operation S4 and the operation S5 can be repeated until the difference in phase between the current and the voltage of the transducer lies in the pre-defined range.

The operation S6 is performed to obtain a frequency of the transducer with the difference in phase between the current and the voltage lying in the pre-defined range as the resonant frequency.

Particularly, there can be only a value of 0 in the pre-defined range, that is, the new preset driving frequency is preset until the current of the transducer is in phase with the voltage thereof, then the operation S6 is performed.

Furthermore the pre-defined range can be a phase difference range including 0, for example, the pre-defined range can be [−2°, 2°] in a practical implementation, that is, when the new preset driving frequency is preset until the difference between the current phase and the voltage phase of the transducer is relatively small, lying in the pre-defined range and needing not to be 0, then operation S6 is performed.

A search for the resonant frequency of the transducer can be performed as described below in a second embodiment, in the case that the new preset driving frequency in the first embodiment above is set to the central frequency of the current hopping-up interval or the current hopping-down interval, and there is only a value of 0 in the pre-defined range.

Second Embodiment

Figure 2:
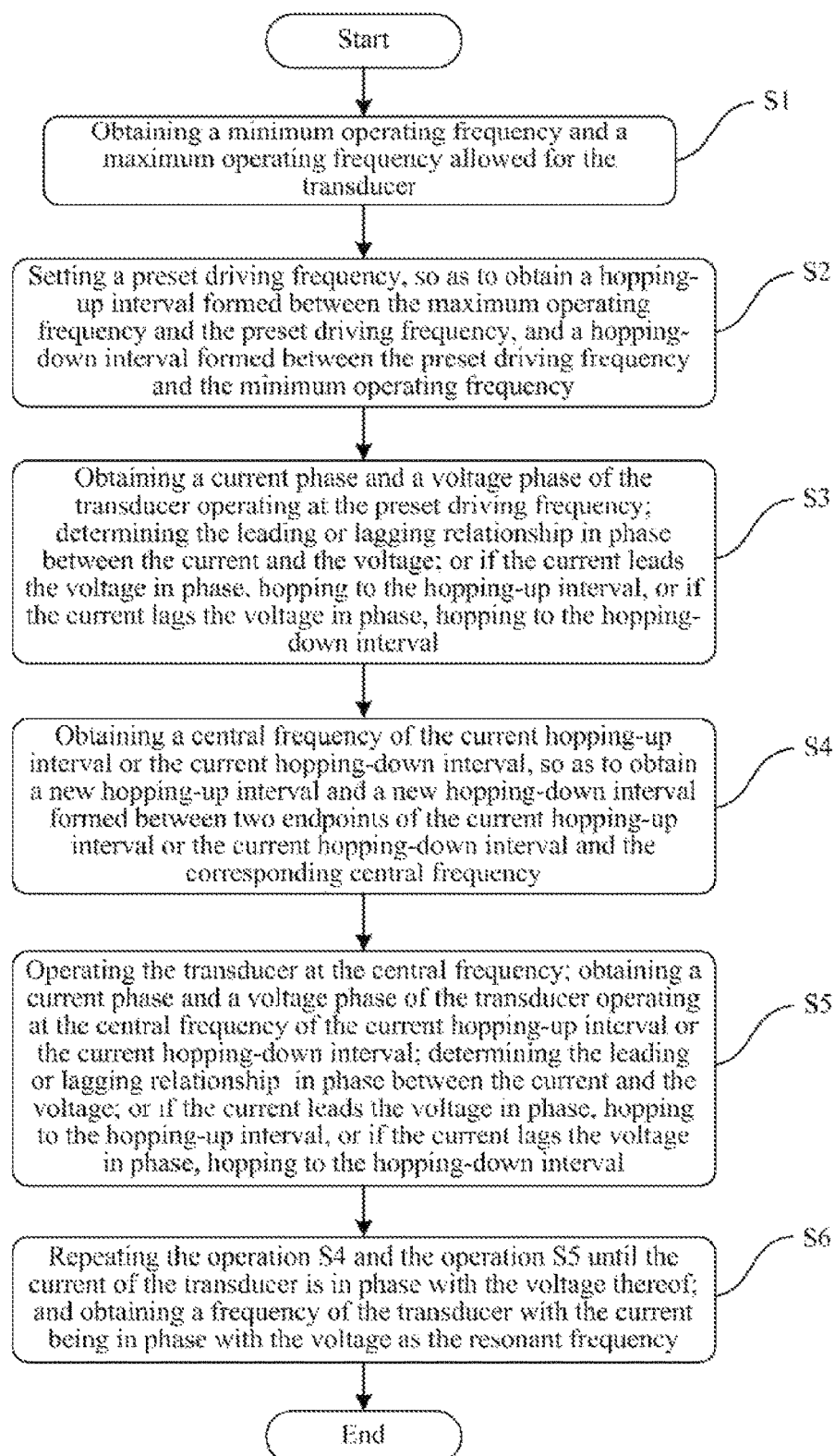
FIG. 2 illustrates a schematic flow chart of a method for searching for a resonant frequency of a transducer according to a second embodiment of the invention.

As illustrated in FIG. 2, a method for searching for a resonant frequency of a transducer according to the invention includes the following operations:

S1. obtaining a minimum operating frequency and a maximum operating frequency allowed for the transducer;

S2. setting a preset driving frequency, so as to obtain a hopping-up interval formed between the maximum operating frequency and the preset driving frequency, and a hopping-down interval formed between the preset driving frequency and the minimum operating frequency;

S3. obtaining a current phase and a voltage phase of the transducer operating at the preset driving frequency; determining the leading or lagging relationship in phase between the current and the voltage; or if the current leads the voltage in phase, hopping to the hopping-up interval, or if the current lags the voltage in phase, hopping to the hopping-down interval;

S4. obtaining a central frequency of the current hopping-up interval or the current hopping-down interval, so as to obtain a new hopping-up interval and a new hopping-down interval formed between two endpoints of the current hopping-up interval or the current hopping-down interval and the corresponding central frequency;

S5. operating the transducer at the central frequency; obtaining a current phase and a voltage phase of the transducer operating at the central frequency of the current hopping-up interval or the current hopping-down interval; determining the leading or lagging relationship in phase between the current and the voltage; or if the current leads the voltage in phase, hopping to the hopping-up interval, or if the current lags the voltage in phase, hopping to the hopping-down interval; and S6. repeating the operation S4 and the operation S5 until the current of the transducer is in phase with the voltage thereof; and obtaining a frequency of the transducer with the current being in phase with the voltage as the resonant frequency.

The respective operations above will be described below in details.

Firstly the operation St is performed to obtain a minimum operating frequency and a maximum operating frequency allowed for the transducer, where the minimum operating frequency and the maximum operating frequency allowed for the transducer can be known from a description of a specification or a related technical document for the transducer being shipped from a manufactory. Typically there are substantially the same minimum operating frequency and maximum operating frequency specified and required for a batch of transducers being shipped from the manufactory.

Next the operation S2 is performed after the minimum operating frequency and the maximum operating frequency allowed for the transducer are obtained.

The operation S2 is performed to set a preset driving frequency, so as to obtain a hopping-up interval formed between the maximum operating frequency and the preset driving frequency, and a hopping-down interval formed between the preset driving frequency and the minimum operating frequency.

If the particular resonant frequency is unknown, then a driving frequency can be preset empirically by collecting frequencies for processing. This preset driving frequency shall lie between the minimum operating frequency and the maximum operating frequency allowed for the transducer.

Particularly in this embodiment, the preset driving frequency can further lie in or around the middle between the minimum operating frequency and the maximum operating frequency allowed for the transducer in the operation S2.

The two intervals are formed with the preset driving frequency being a boundary after the minimum operating frequency and the maximum operating frequency allowed for the transducer, and the preset driving frequency are obtained. Particularly the hopping-up interval is formed between the maximum operating frequency and the preset driving frequency, that is, two endpoints of the hopping-up interval are the maximum operating frequency and the preset driving frequency respectively; and the hopping-down interval is formed between the preset driving frequency and the minimum operating frequency, that is, two endpoints of the hopping-down interval are the minimum operating frequency and the preset driving frequency. Next the operation S3 is performed after the hopping-up interval and the hopping-down interval are determined.

The operation S3 is performed to obtain a current phase and a voltage phase of the transducer operating at the preset driving frequency; to determine the leading or lagging relationship in phase between the current and the voltage; or if the current leads the voltage in phase, to hop to the hopping-up interval, or if the current lags the voltage in phase, to hop to the hopping-down interval.

Particularly in this embodiment, the transducer operates at the preset driving frequency, the current phase and the voltage phase of the transducer operating at the preset driving frequency are acquired or measured, the leading or lagging relationship in phase between the current and the voltage is determined, or if the current leads the voltage in phase, then there is a capacitive load, which indicates that the current frequency of the transducer is lower, and the resonant frequency at the resonance point shall be higher than the current frequency of the transducer, so further searching shall be performed within the hopping-up interval (between the maximum operating frequency and the preset driving frequency).

On the contrary, if the voltage leads the current in phase, then there is an inductive load, which indicates that the current frequency of the transducer is higher, and the resonant frequency shall be lower than the current frequency of the transducer, so further searching shall be performed within the hopping-down interval (between the minimum operating frequency and the preset driving frequency). Apparently the search range can be halved due to the operation S3 in this search method.

Next the operation S4 is performed after the determining which one of the current phase and the voltage phase currently of the transducer is higher or lower, and the hop is made to the hopping-up interval or the hopping-down interval.

The operation S4 is performed to obtain a central frequency of the current hopping-up interval or the current hopping-down interval, and to form a new hopping-up interval and a new hopping-down interval between two endpoints of the current hopping-up interval or the current hopping-down interval and the corresponding central frequency. In fact, the current hopping-up interval or the current hopping-down interval is further searched for the resonant frequency in the operation S4. Particularly the central frequency of the current hopping-up interval or the current hopping-down interval is obtained, and the new hopping-up interval and the new hopping-down interval are formed between the two endpoints of the current hopping-up interval or the current hopping-down interval and the corresponding central frequency.

Particularly if the hop is made to the hopping-up interval to further search for the resonant frequency in the operation S3, then in the operation S4, the central frequency of the hopping-up interval is obtained, and the new hopping-up interval and the new hopping-down interval are formed between the two endpoints of the current hopping-up interval (i.e., the maximum operating frequency and the preset driving frequency) and the corresponding central frequency.

Still furthermore, if the hop is made to the hopping-up interval to further search for the resonant frequency in the operation S3, then in the operation S4, the new hopping-up interval is formed between the central frequency of the original hopping-up interval and the higher one of the two endpoints of the original hopping-up interval, that is, two endpoints of the new hopping-up interval are the maximum operating frequency and the central frequency respectively; and the new hopping-down interval is formed between the central frequency and the lower one of the two endpoints, that is, two endpoints of the new hopping-down interval are the preset driving frequency and the central frequency respectively.

Correspondingly, if the hop is made to the hopping-down interval to further search for the resonant frequency in the operation S3, then in the operation S4, the central frequency of the hopping-down interval is obtained, and the new hopping-up interval and the new hopping-down interval are formed between the two endpoints of the current hopping-down interval (i.e., the minimum operating frequency and the preset driving frequency) and the corresponding central frequency.

Still furthermore, if the hop is made to the hopping-down interval to further search for the resonant frequency in the operation S3, then in the operation S4, the new hopping-up interval is formed between the central frequency of the original hopping-down interval and the higher one of two endpoints of the original hopping-down interval, that is, two endpoints of the new hopping-up interval are the preset driving frequency and the central frequency respectively; and the new hopping-down interval is formed between the central frequency and the lower one of the two endpoints, that is, two endpoints of the new hopping-down interval are the central frequency and the minimum operating frequency respectively.

Next the operation S5 is performed after the new hopping-up interval and the new hopping-down interval are determined.

The operation S5 is performed to operate the transducer at the central frequency; to obtain a current phase and a voltage phase of the transducer operating at the central frequency of the current hopping-up interval or the current hopping-down interval; to determine the leading or lagging relationship in phase between the current and the voltage; or if the current leads the voltage in phase, hop to the hopping-up interval, or if the current lags the voltage in phase, hop to the hopping-down interval.

In fact, the frequency hopping in the operation S5 is equivalent to that in the operation S3.

Particularly in this embodiment, after the new hopping-up interval and the new hopping-down interval are determined, the current phase and the voltage phase of the transducer operating at the central frequency of the current hopping-up interval or the current hopping-down interval are measured and acquired, the leading or lagging relationship in phase between the current and the voltage is determined, or if the current leads the voltage in phase, then there is a capacitive load, which indicates that the current frequency of the transducer is lower, and the resonant frequency shall be higher than the current frequency of the transducer, so further searching shall be performed within the new hopping-up interval (between the maximum operating frequency and the central frequency or between the preset driving frequency and the central frequency).

On the contrary, if the voltage leads the current in phase, then there is an inductive load, which indicates that the current frequency of the transducer is higher, and the resonant frequency shall be lower than the current frequency of the transducer, so further searching shall be performed within the new hopping-down interval (between the preset driving frequency and the central frequency or between the central frequency and the minimum operating frequency). Apparently the search range can be further narrowed to one fourth thereof due to the operation S5 in this search method. Next the operation S6 is performed.

The operation S6 is performed to repeat the operation S4 and the operation S5 until the current of the transducer is in phase with the voltage thereof; and to obtain a frequency of the transducer with the current being in phase with the voltage as the resonant frequency.

Third Embodiment

Figure 3:
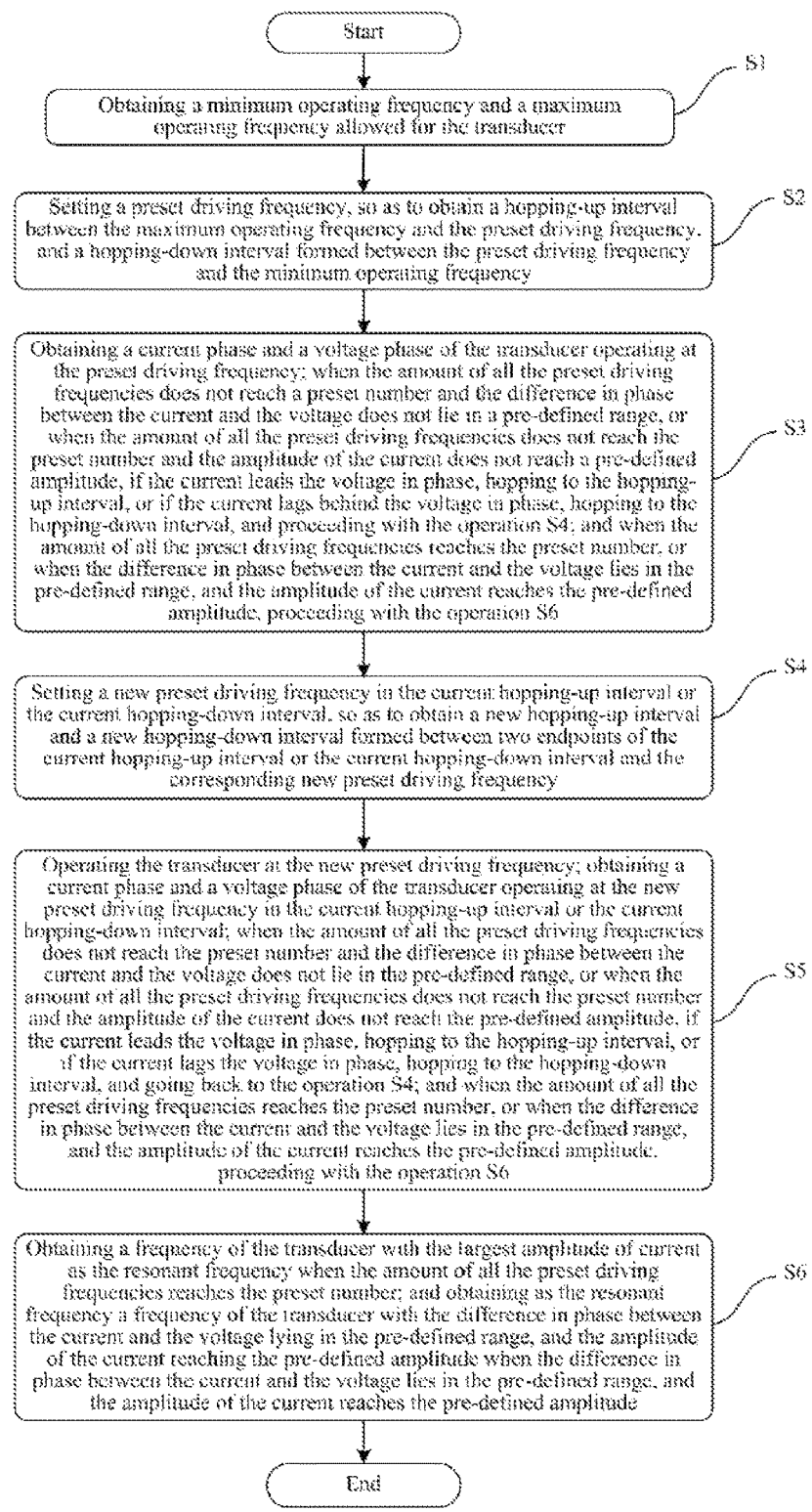
FIG. 3 illustrates a schematic flow chart of a method for searching for a resonant frequency of a transducer according to an embodiment of the invention.

Referring to FIG. 3, there is illustrated a schematic flow chart of another method for searching for a resonant frequency of a transducer according to the invention. As illustrated in FIG. 3, another method for searching for a resonant frequency of a transducer according to the invention includes the following operations:

S1. obtaining a minimum operating frequency and a maximum operating frequency allowed for the transducer;

S2. setting a preset driving frequency, so as to obtain a hopping-up interval between the maximum operating frequency and the preset driving frequency, and a hopping-down interval formed between the preset driving frequency and the minimum operating frequency;

S3. obtaining a current phase and a voltage phase of the transducer operating at the preset driving frequency; when the amount of all the preset driving frequencies does not reach a preset number and the difference in phase between the current and the voltage does not lie within a pre-defined range, or when the amount of all the preset driving frequencies does not reach the preset number and the amplitude of the current does not reach a pre-defined amplitude, if the current leads the voltage in phase, hopping to the hopping-up interval, or if the current lags behind the voltage in phase, hopping to the hopping-down interval, and proceeding with the operation S4; and when the amount of all the preset driving frequencies reaches the preset number, or when the difference in phase between the current and the voltage lies within the pre-defined range, and the amplitude of the current reaches the pre-defined amplitude, proceeding with the operation S6;

S4. setting a new preset driving frequency in the current hopping-up interval or the current hopping-down interval, so as to obtain a new hopping-up interval and a new hopping-down interval formed between two endpoints of the current hopping-up interval or the current hopping-down interval and the corresponding new preset driving frequency;

S5. operating the transducer at the new preset driving frequency; obtaining a current phase and a voltage phase of the transducer operating at the new preset driving frequency in the current hopping-up interval or the current hopping-down interval; when the amount of all the preset driving frequencies does not reach the preset number and the difference in phase between the current and the voltage does not lie within the pre-defined range, or when the amount of all the preset driving frequencies does not reach the preset number and the amplitude of the current does not reach the pre-defined amplitude, if the current leads the voltage in phase, hopping to the hopping-up interval, or if the current lags the voltage in phase, hopping to the hopping-down interval, and going back to the operation S4; and when the amount of all the preset driving frequencies reaches the preset number, or when the difference in phase between the current and the voltage lies in the pre-defined range, and the amplitude of the current reaches the pre-defined amplitude, proceeding with the operation S6; and S6. obtaining a frequency of the transducer with the largest amplitude of current as the resonant frequency when the amount of all the preset driving frequencies reaches the preset number; and obtaining as the resonant frequency a frequency of the transducer with the difference in phase between the current and the voltage lying in the pre-defined range, and the amplitude of the current reaching the pre-defined amplitude when the difference in phase between the current and the voltage lies in the pre-defined range, and the amplitude of the current reaches the pre-defined amplitude.

The respective operations above will be described below in details.

For details of the operation S1 and the operation S2, reference can be made to operation S1 and the operation S2 in the first embodiment above, so a repeated description thereof will be omitted here.

The operation S3 is performed to obtain a current phase and a voltage phase of the transducer operating at the preset driving frequency; and when the amount of all the preset driving frequencies does not reach a preset number and the difference in phase between the current and the voltage does not lie in a pre-defined range, or when the amount of all the preset driving frequencies does not reach the preset number and the amplitude of the current does not reach a pre-defined amplitude, if the current leads the voltage in phase, to hop to the hopping-up interval, or if the current lags the voltage in phase, to hop to the hopping-down interval, and to proceed with the operation S4; when the amount of all the preset driving frequencies reaches the preset number, or when the difference in phase between the current and the voltage lies in the pre-defined range, and the amplitude of the current reaches the pre-defined amplitude, to proceed with the operation S6.

Particularly the preset number is a preset searching times, which can be preset reasonably from experimental data; the pre-defined amplitude shall be no less than the minimum current amplitude for the transducer to operate normally as technically required; and the value of 0 can be included within the pre-defined range, and the pre-defined range can also be a phase difference range including value of 0.

Particularly in this embodiment, the transducer operates at the preset driving frequency, the current phase and the voltage phase of the transducer operating at the preset driving frequency are acquired or measured, or if the current leads the voltage in phase, then there is a capacitive load, which indicates that the current frequency of the transducer is lower, and the resonant frequency shall be higher than the current frequency of the transducer, so when the amount of all the preset driving frequencies does not reach the preset number and the difference in phase between the current and the voltage does not lie in the pre-defined range, or when the amount of all the preset driving frequencies does not reach the preset number and the amplitude of the current does not reach the pre-defined amplitude, further searching shall be performed within the hopping-up interval (between the maximum operating frequency and the preset driving frequency); and on the contrary, if the voltage leads the current in phase, then there is an inductive load, which indicates that the current frequency of the transducer is higher, and the resonant frequency shall be lower than the current frequency of the transducer, so when the amount of all the preset driving frequencies does not reach the preset number and the difference in phase between the current and the voltage does not lie in the pre-defined range, or when the amount of all the preset driving frequencies does not reach the preset number and the amplitude of the current does not reach the pre-defined amplitude, further searching shall be performed within the hopping-down interval (between the minimum operating frequency and the preset driving frequency). Apparently the search range can be halved due to the operation S3 in this search method.

For details of the operation S4, reference can be made to the operation S4 in the first embodiment above, so a repeated description thereof will be omitted here.

The operation S5 is performed to operate the transducer at the new preset driving frequency; to obtain a current phase and a voltage phase of the transducer operating at the new preset driving frequency in the current hopping-up interval or the current hopping-down interval; when the amount of all the preset driving frequencies does not reach the preset number and the difference in phase between the current and the voltage does not lie in the pre-defined range, if the current leads the voltage in phase, to hop to the hopping-up interval, or if the current lags the voltage in phase, to hop to the hopping-down interval, and to go back to the operation S4; and when the amount of all the preset driving frequencies reaches the preset number, or when the difference in phase between the current and the voltage lies in the pre-defined range and the amplitude of the current reaches the pre-defined amplitude, to proceed with the operation S6.

In fact, the frequency hopping in the operation S5 is equivalent to that in the operation S3.

Particularly in this embodiment, after the new hopping-up interval and the new hopping-down interval are determined, the current phase and the voltage phase of the transducer operating at the preset driving frequency in the current hopping-up interval or the current hopping-down interval are measured and acquired, or if the current leads the voltage in phase, then there is a capacitive load, which indicates that the current frequency of the transducer is lower, and the resonant frequency shall be higher than the current frequency of the transducer, so when the amount of all the preset driving frequencies does not reach the preset number and the difference in phase between the current and the voltage does not lie in the pre-defined range, or when the amount of all the preset driving frequencies does not reach the preset number and the amplitude of the current does not reach the pre-defined amplitude, further searching shall be performed within the new hopping-up interval (between the maximum operating frequency and the new preset driving frequency or between the original preset driving frequency and the new preset driving frequency); and on the contrary, if the voltage leads the current in phase, then there is an inductive load, which indicates that the current frequency of the transducer is higher, and the resonant frequency shall be lower than the current frequency of the transducer, so when the amount of all the preset driving frequencies does not reach the preset number and the difference in phase between the current and the voltage does not lie in the pre-defined range, or when the amount of all the preset driving frequencies does not reach the preset number and the amplitude of the current does not reach the pre-defined amplitude, further searching shall be performed within the new hopping-down interval (between the original preset driving frequency and the new preset driving frequency or between the new preset driving frequency and the minimum operating frequency). Apparently the search range can be further narrowed due to the operation S5 in this search method, and the operation S4 and the operation S5 can be repeated until the amount of all the preset driving frequencies reaches the preset number, or the difference in phase between the current and the voltage of the transducer lies in the pre-defined range and the amplitude of the current reaches the pre-defined amplitude.

The operation S6 is performed to obtain the frequency of the transducer with the largest amplitude of current as the resonant frequency when the amount of all the preset driving frequencies reaches the preset number; to obtain as the resonant frequency the frequency of the transducer with the difference in phase between the current and the voltage lying in the pre-defined range, and the amplitude of the current reaching the pre-defined amplitude when the difference in phase between the current and the voltage lies in the pre-defined range, and the amplitude of the current reaches the pre-defined amplitude.

Furthermore in the case that there is only a value of 0 in the pre-defined range, that is, the new preset driving frequency is preset until the amount of all the preset driving frequencies reaches the preset number, or the current of the transducer is in phase with the voltage thereof, and the amplitude of the current reaches the pre-defined amplitude, then the operation S6 is performed.

Furthermore in the case that the pre-defined range is a phase difference range including 0, that is, the new preset driving frequency is preset until the amount of all the preset driving frequencies reaches the preset number, or the difference between the current phase and the voltage phase of the transducer is relatively small, lying in the pre-defined range, and the amplitude of the current reaches the pre-defined amplitude, then the operation S6 is performed. At this time the difference between the current phase and the voltage phase of the transducer may not be 0.

In fact, the method for searching for a resonant frequency of a transducer according to the invention sets a new preset driving frequency continuously in the original hopping-up interval or the original hopping-down interval, forms two new corresponding hopping-up interval and hopping-down interval respectively, and then determines the relationship between the current phase and the voltage phase, and determines one of the intervals for the next search, so that the search range of the interval for the last search can be narrowed by at least half thereof in each frequency hopping. That is, the resonant frequency can be found after a maximum number $[\log_2 n]$ of searches, where n represents the difference between the minimum operating frequency and the maximum operating frequency allowed for the transducer. Apparently the search method according to the invention between the frequency hopping can greatly lower the number of searches and also can shorten the operating period of time and lower the rise in temperature of the transducer to thereby improve the accuracy of the search for the resonant frequency, lower in effect the number of times that the transducer operates uselessly, improve the utilization ratio and lifetime of the transducer, and also lower the cost thereof in use. Moreover the invention can be supplemented with a function of detecting in real time the operating state of the transducer due to the short search period of time.

The invention further provides a system for searching for a resonant frequency of a transducer, including:

a searching interval determining unit configured to determine a current searching interval for searching for the resonant frequency of the transducer, and to set a preset driving frequency in the current searching interval;

a hopping interval generating unit configured to determine a hopping-up interval and a hopping-down interval according to the preset driving frequency and two endpoints of the current searching interval;

a determining unit configured to obtain a current phase and a voltage phase of the transducer operating at the preset driving frequency, and to determine whether a preset condition is satisfied;

an interval hopping control unit configured to hop to the hopping-up interval or the hopping-down interval according to a relationship between the current phase and the voltage phase and to take the hopping-up interval or the hopping-down interval as a new searching interval for the resonant frequency if the preset condition is not satisfied; and a resonant frequency obtaining unit configured to obtain a corresponding frequency of the transducer as the resonant frequency if the preset condition is satisfied.

In an embodiment, if the current searching interval is an initial searching interval, then the two endpoints of the initial searching interval are a minimum operating frequency and a maximum operating frequency allowed for the transducer, respectively.

In an embodiment, the preset driving frequency is a central frequency within the current searching interval.

In an embodiment, the hopping interval generating unit is further configured:

to determine the hopping-up interval according to the preset driving frequency and a higher one of the two endpoints; and to determine the hopping-down interval according to the preset driving frequency and a lower one of the two endpoints.

In an embodiment, the determining unit is further configured to determine whether a difference in phase between the current and the voltage lies in a pre-defined range;

the interval hopping control unit is further configured to hop to the hopping-up interval or the hopping-down interval according to a relationship between the current phase and the voltage phase and taking the hopping-up interval or the hopping-down interval as the new searching interval for the resonant frequency if the difference in phase between the current and the voltage does not lie in the pre-defined range; and the resonant frequency obtaining unit is further configured to obtain a frequency of the transducer with the difference in phase between the current and the voltage lying in the pre-defined range as the resonant frequency if the difference in phase between the current and the voltage lies in a pre-defined range.

In an embodiment, the interval hopping control unit is further configured:

to hop to the hopping-up interval and taking the hopping-up interval as the new searching interval for the resonant frequency if the current leads the voltage in phase; or to hop to the hopping-down interval, and taking the hopping-down interval as the new searching interval for the resonant frequency if the current lags the voltage in phase.

In an embodiment, the determining unit is further configured to determine whether an amount of all preset driving frequencies reaches a preset number, and to determine whether a difference in phase between a current and a voltage lies in a pre-defined range, and to determine whether an amplitude of the current reaches a pre-defined amplitude;

the interval hopping control unit is further configured to hop to the hopping-up interval or the hopping-down interval according to the relationship between the current phase and the voltage phase and to take the hopping-up interval or the hopping-down interval as the new searching interval for the resonant frequency, when the amount of all the preset driving frequencies does not reach the preset number and the difference in phase between the current and the voltage does not lie in the pre-defined range, or when the amount of all the preset driving frequencies does not reach the preset number and the amplitude of the current does not reach the pre-defined amplitude;

the resonant frequency obtaining unit is further configured to obtain a frequency of the transducer with a largest amplitude of current as the resonant frequency when the amount of all the preset driving frequencies reaches the preset number; or to obtain a frequency as the resonant frequency at which the difference in phase between the current and the voltage of the transducer lies in the pre-defined range, and the amplitude of the current reaches the pre-defined amplitude.

In an embodiment, the interval hopping control unit is further configured:

to hop to the hopping-up interval and taking the hopping-up interval as the new searching interval for the resonant frequency if the current leads the voltage in phase; or to hop to the hopping-down interval, and taking the hopping-down interval as the new searching interval for the resonant frequency if the current lags the voltage in phase.

In an embodiment, wherein there is only a value of 0 in the pre-defined range.

The system for searching for a resonant frequency of a transducer according to the present invention will be described in more details, taking three embodiments below for example.

Fourth Embodiment

Figure 4:
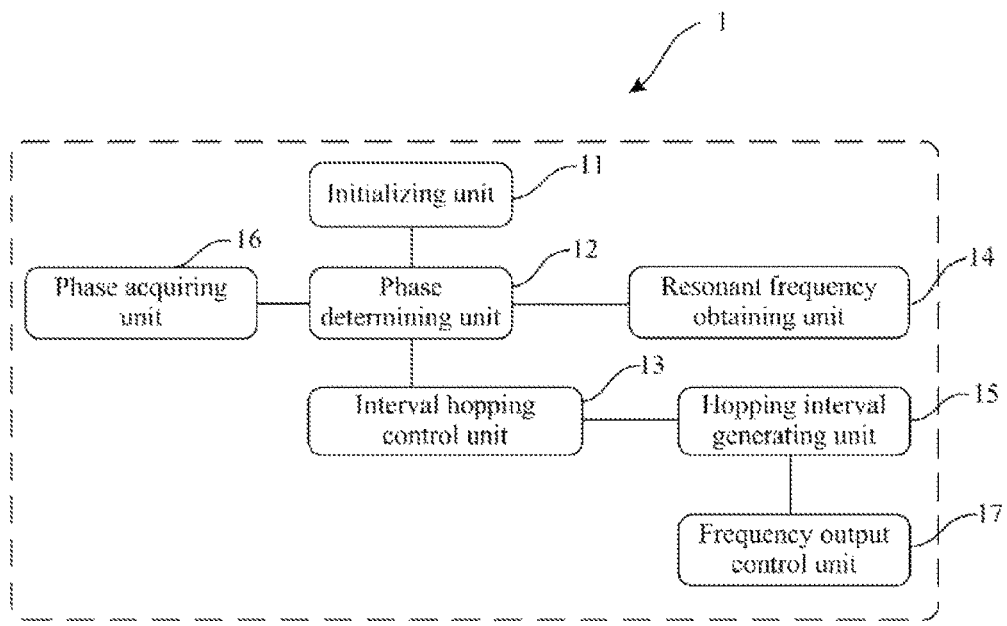
FIG. 4 illustrates a schematic structural diagram of a system for searching for a resonant frequency of a transducer according to an embodiment of the invention.
Figure 5:
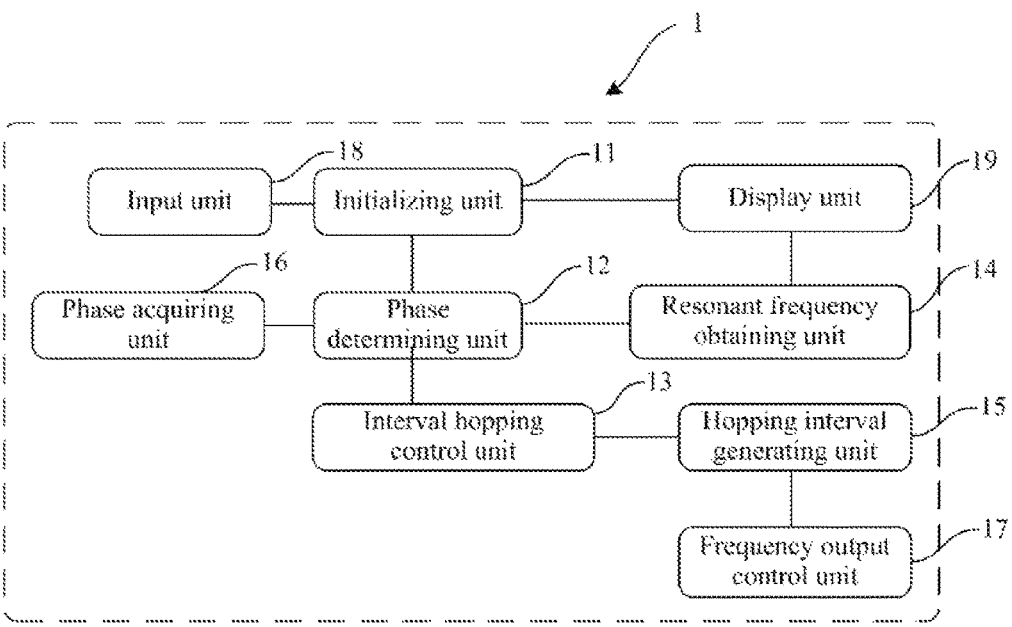
FIG. 5 illustrates a schematic structural diagram of a preferred system for searching for a resonant frequency of a transducer according to an embodiment of the invention.

In order to perform the method according to the first embodiment of the invention, the invention further provides a system for searching for a resonant frequency of a transducer, and as illustrated in FIG. 4 and FIG. 5, the system 1 for searching for a resonant frequency of a transducer particularly includes: an initializing unit 11, a phase determining unit 12, an interval hopping control unit 13, a hopping interval generating unit 15, a frequency output control unit 17, a phase acquiring unit 16, a resonant frequency obtaining unit 14, an input unit 18, and a display unit 19.

The initializing unit 11 is configured to perform the following initialization work: obtaining a minimum operating frequency and a maximum operating frequency allowed for the transducer; setting a preset driving frequency, so as to obtain a hopping-up interval formed between the maximum operating frequency and the preset driving frequency, and a hopping-down interval formed between the preset driving frequency and the minimum operating frequency, and obtaining a current phase and a voltage phase of the transducer operating at the preset driving frequency.

Figure 6:
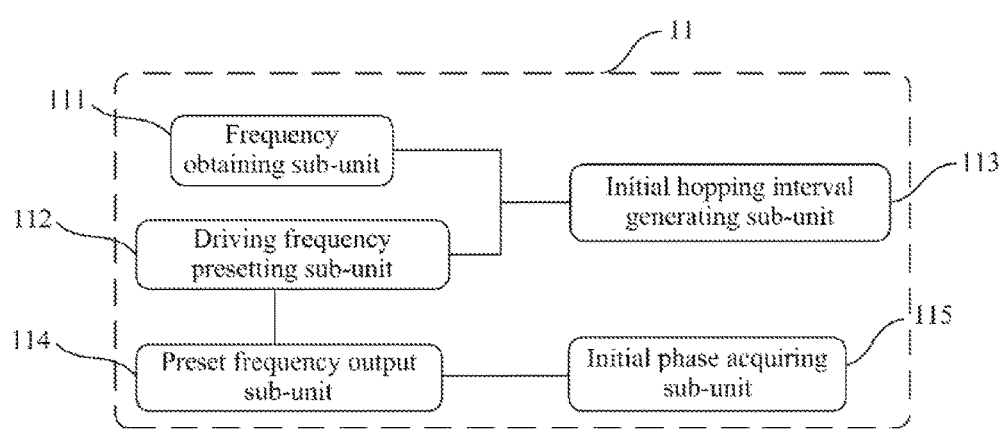
FIG. 6 illustrates a schematic structural diagram of an initializing unit in a system for searching for a resonant frequency of a transducer according to an embodiment of the invention.

In this embodiment, as illustrated in FIG. 6, the initializing unit 11 particularly includes a frequency obtaining sub-unit 111, a driving frequency presetting sub-unit 112, an initial hopping interval generating sub-unit 113, a preset frequency output sub-unit 114, and an initial phase acquiring sub-unit 115.

The frequency obtaining sub-unit 111 is configured to obtain the minimum operating frequency and the maximum operating frequency allowed for the transducer, where the minimum operating frequency and the maximum operating frequency allowed for the transducer can be known from a description of a specification or a related technical document for the transducer being shipped from a manufactory. Typically there are substantially the same minimum operating frequency and maximum operating frequency specified and required for a batch of transducers being shipped from the manufactory.

Particularly as illustrated in FIG. 5, the minimum operating frequency, the maximum operating frequency, and the preset driving frequency can be input to the initializing unit 11 through the input unit 18. The input unit 18 includes a keyboard, an input box, etc.

The content input by the input unit 18 can be displayed by the display unit 19.

The driving frequency presetting sub-unit 112 is configured to set a preset driving frequency. If the specific resonant frequency is unknown, then a driving frequency can be preset empirically by collecting frequencies for processing. This preset driving frequency shall lie between the minimum operating frequency and the maximum operating frequency allowed for the transducer.

Particularly in this embodiment, the preset driving frequency can further lie in or around the middle between the minimum operating frequency and the maximum operating frequency allowed for the transducer.

The initial hopping interval generating sub-unit 113 connected with the frequency obtaining sub-unit Ill and the driving frequency presetting sub-unit 112 is configured to form the hopping-up interval between the maximum operating frequency and the preset driving frequency, and to form the hopping-down interval between the preset driving frequency and the minimum operating frequency.

The two intervals are obtained with the preset driving frequency being a boundary after the minimum operating frequency and the maximum operating frequency allowed for the transducer, and the preset driving frequency are obtained. Particularly the hopping-up interval is formed between the maximum operating frequency and the preset driving frequency, that is, two endpoints of the hopping-up interval are the maximum operating frequency and the preset driving frequency respectively; and the hopping-down interval is formed between the preset driving frequency and the minimum operating frequency, that is, two endpoints of the hopping-down interval are the preset driving frequency and the minimum operating frequency.

The preset frequency output sub-unit 114 is configured to excite the transducer with the preset driving frequency so that the transducer operates at the preset driving frequency.

The initial phase acquiring sub-unit 115 is configured to obtain the current phase and the voltage phase of the transducer operating at the preset driving frequency.

The phase determining unit 12 connected with the initializing unit 11 is configured, when the difference in phase between the current and the voltage does not lie in a pre-defined range, if the current leads the voltage in phase, to output a first result, or if the current lags the voltage in phase, to output a second result; or when the difference in phase between the current and the voltage lies in the pre-defined range, to output a third result.

Particularly there is only a value of 0 in the pre-defined range, or the pre-defined range can also be a phase difference range including 0.

Particularly in this embodiment, after the transducer operates at the preset driving frequency, and the current phase and the voltage phase of the transducer operating at the preset driving frequency are acquired or measured, the phase determining unit 12 is configured to determine the leading or lagging relationship in phase between the current and the voltage, and when the difference in phase between the current and the voltage does not lie in the pre-defined range, if the current leads the voltage, to determine that there is a capacitive load, which indicates that the current frequency of the transducer is lower, and the resonant frequency shall be higher than the current frequency of the transducer, so further searching shall be performed within the hopping-up interval, and to output the first result indicating that the hop shall be made to the hopping-up interval for a further search; and on the contrary, if the voltage leads the current in phase, to determine that there is an inductive load, which indicates that the current frequency of the transducer is higher, and the resonant frequency shall be lower than the current frequency of the transducer, so further searching shall be performed within the hopping-down interval, to output the second result indicating that the hop shall be made to the hopping-down interval for a further search. Apparently the search range can be narrowed in this search method.

When the voltage phase is equal to or close to the current phase, that is, the difference in phase between the current and the voltage lies in the pre-defined range, which indicates that the current frequency of the transducer is the resonant frequency, the search can be stopped at this time, and the third result can be output indicating the search shall be stopped from being continued.

The interval hopping control unit 13 connected with the phase determining unit 12 is configured to make a hop to the hopping-up interval upon reception of the first result output by the phase determining unit 12, and to make a hop to the hopping-down interval upon reception of the second result output by the phase determining unit 12.

The hopping interval generating unit 15 connected with the interval hopping control unit 13 is configured to set a new preset driving frequency in the current hopping-up interval or the current hopping-down interval, and so as to obtain a new hopping-up interval and a new hopping-down interval formed between two endpoints of the current hopping-up interval or the current hopping-down interval and the corresponding new preset driving frequency. In fact, further searching for the resonant frequency shall be performed within the current hopping-up interval or the current hopping-down interval.

Particularly a central frequency of the current hopping-up interval or the current hopping-down interval can be obtained as the new preset driving frequency, and the new hopping-up interval and the new hopping-down interval can be formed between the two endpoints of the current hopping-up interval or the current hopping-down interval and the corresponding central frequency; alternatively, any frequency can be obtained in the current hopping-up interval or the current hopping-down interval as the new preset driving frequency, and the new hopping-up interval and the new hopping-down interval can be formed, and preferably the new preset driving frequency can be preset as a function of the difference in phase between the current and the voltage currently of the transducer so that the new preset driving frequency is preset farther from the current preset driving frequency if the difference in phase between the current and the voltage of the transducer is larger, and the new preset driving frequency is preset closer to the current preset driving frequency if the difference in phase between the current and the voltage of the transducer is smaller.

Particularly, if the hop is made to the hopping-up interval to further search for the resonant frequency, then a central frequency of the hopping-up interval can be obtained as the new preset driving frequency, and the new hopping-up interval and the new hopping-down interval can be formed between the two endpoints of the current hopping-up interval and the central frequency; or another frequency than the central frequency in the hopping-up interval can be obtained as the new preset driving frequency, and the new hopping-up interval and the new hopping-down interval can be formed between the two endpoints of the current hopping-up interval and the another frequency than the central frequency.

Still furthermore, if the hop is made to the hopping-up interval to further search for the resonant frequency, then the new hopping-up interval is formed between the new preset driving frequency and the higher one of the two endpoints of the original hopping-up interval; and the new hopping-down interval is formed between the new preset driving frequency and the lower one of the two endpoints.

Correspondingly, if the hop is made to the hopping-down interval to further search for the resonant frequency, then a central frequency of the hopping-down interval can be obtained as the new preset driving frequency, and the new hopping-up interval and the new hopping-down interval can be formed between the two endpoints of the current hopping-down interval and the central frequency; or another frequency than the central frequency in the hopping-down interval can be obtained as the new preset driving frequency, and the new hopping-up interval and the new hopping-down interval can be formed between the two endpoints of the current hopping-down interval and the another frequency than the central frequency.

Still furthermore, if the hop is made to the hopping-down interval to further search for the resonant frequency, then the new hopping-up interval is formed between the new preset driving frequency and the higher one of the two endpoints of the original hopping-down interval; and the new hopping-down interval is formed between the new preset driving frequency and the lower one of the two endpoints.

The frequency output control unit 17 connected with the hopping interval generating unit 15 and the transducer is configured to excite the transducer with the new preset driving frequency in the current hopping-up interval or the hopping-down interval so that the transducer operates at the new preset driving frequency.

The phase acquiring unit 16 connected with the phase determining unit 12 and the transducer is configured to obtain a current phase and a voltage phase of the transducer operating at the new preset driving frequency in the current hopping-up interval or the current hopping-down interval, and to output the obtained current phase and voltage phase to the phase determining unit 12 so that the phase determining unit 12 makes the determination.

The resonant frequency obtaining unit 14 connected with the phase determining unit 12 is configured to obtain a frequency of the transducer with the difference in phase between the current and the voltage lying in the pre-defined range as the resonant frequency upon reception of the third result output by the phase determining unit 12. The resonant frequency obtained by the resonant frequency obtaining unit 14 can be displayed by the display unit 19.

Fifth Embodiment

In order to perform the method according to the second embodiment, the invention further provides a system for searching for a resonant frequency of a transducer, and for details of a schematic structural diagram thereof, reference can be made to the schematic structural diagram of the system for searching for a resonant frequency of a transducer according to the fourth embodiment above, the system including:

An initializing unit, a phase determining unit, an interval hopping control unit, a hopping interval generating unit, a frequency output control unit, a phase acquiring unit, a driving frequency obtaining unit, an input unit, and a display unit.

The initializing unit is configured to perform the following initialization work: obtaining a minimum operating frequency and a maximum operating frequency allowed for the transducer; setting a preset driving frequency, so as to obtain a hopping-up interval formed between the maximum operating frequency and the preset driving frequency, and a hopping-down interval formed between the preset driving frequency and the minimum operating frequency; and obtaining a current phase and a voltage phase of the transducer operating at the preset driving frequency.

In this embodiment, the initializing unit particularly includes a frequency obtaining sub-unit, a driving frequency presetting sub-unit, an initial hopping interval generating sub-unit, a preset frequency output sub-unit, and an initial phase acquiring sub-unit.

The frequency obtaining sub-unit is configured to obtain the minimum operating frequency and the maximum operating frequency allowed for the transducer, where the minimum operating frequency and the maximum operating frequency allowed for the transducer can be known from a description of a specification or a related technical document for the transducer being shipped from a manufactory. Typically there are substantially the same minimum operating frequency and maximum operating frequency specified and required for a batch of transducers being shipped from the manufactory.

Particularly, the minimum operating frequency, the maximum operating frequency, and the preset driving frequency can be input to the initializing unit through the input unit. The input unit includes a keyboard, an input box, etc.

The content input by the input unit can be displayed by the display unit.

The driving frequency presetting sub-unit is configured to set a preset driving frequency. If the particular frequency at the resonance point is unknown, then a resonant frequency can be preset empirically by collecting frequencies for processing. This preset driving frequency shall lie between the minimum operating frequency and the maximum operating frequency allowed for the transducer.

Particularly in this embodiment, the preset driving frequency can further lie in or around the middle between the minimum operating frequency and the maximum operating frequency allowed for the transducer.

The initial hopping interval generating sub-unit connected with the frequency obtaining sub-unit and the driving frequency presetting sub-unit is configured to form the hopping-up interval between the maximum operating frequency and the preset driving frequency, and to form the hopping-down interval between the preset driving frequency and the minimum operating frequency.

The two intervals are formed with the preset driving frequency being a boundary after the minimum operating frequency and the maximum operating frequency allowed for the transducer, and the preset driving frequency are obtained. Particularly the hopping-up interval is formed between the maximum operating frequency and the preset driving frequency, that is, two endpoints of the hopping-up interval are the maximum operating frequency and the preset driving frequency respectively; and the hopping-down interval is formed between the preset driving frequency and the minimum operating frequency, that is, two endpoints of the hopping-down interval are the minimum operating frequency and the preset driving frequency.

The preset frequency output sub-unit is configured to excite the transducer with the preset driving frequency so that the transducer operates at the preset driving frequency.

The initial phase acquiring sub-unit is configured to obtain the current phase and the voltage phase of the transducer operating at the preset driving frequency.

The phase determining unit connected with the initializing unit is configured to determine the leading or lagging relationship in phase between the current and the voltage, or if the current leads the voltage in phase, to output a first result, if the current lags the voltage in phase, to output a second result; or if the current phase is equal to the voltage phase, to output a third result.

Particularly in this embodiment, after the transducer operates at the preset driving frequency, and the current phase and the voltage phase of the transducer operating at the preset driving frequency are acquired or measured, the phase determining unit is configured to determine the leading or lagging relationship in phase between the current and the voltage, or if the current leads the voltage in phase, then to determine that there is a capacitive load, which indicates that the current frequency of the transducer is lower, and the resonant frequency shall be higher than the current frequency of the transducer, so further searching shall be performed within the hopping-up interval (between the maximum operating frequency and the preset driving frequency), to output the first result indicating that the hop shall be made to the hopping-up interval for a further search;

On the contrary, if the voltage leads the current in phase, then to determine that there is an inductive loud, which indicates that the current frequency of the transducer is higher, and the resonant frequency shall be lower than the current frequency of the transducer, so further searching shall be performed within the hopping-down interval (between the minimum operating frequency and the preset driving frequency), to output the second result indicating that the hop shall be made to the hopping-down interval for a further search. Apparently the search range can be halved in this search method; and Preferably, if the voltage phase is equal to the current phase, which indicates that the current frequency of the transducer is the resonant frequency, so the search shall be stopped, to output the third result indicating that the search shall be stopped from being continued.

The interval hopping control unit connected with the phase determining unit is configured to make a hop to the hopping-up interval upon reception of the first result output by the phase determining unit, and to make a hop to the hopping-down interval upon reception of the second result output by the phase determining unit.

The hopping interval generating unit connected with the interval hopping control unit is configured to obtain a central frequency of the current hopping-up interval or the current hopping-down interval, and to form a new hopping-up interval and a new hopping-down interval between two endpoints of the current hopping-up interval or the current hopping-down interval and the corresponding central frequency.

A central frequency of the current hopping-up interval or the current hopping-down interval is obtained, and a new hopping-up interval and a new hopping-down interval between two endpoints of the current hopping-up interval or the current hopping-down interval and the corresponding central frequency are formed. In fact, further searching for the resonant frequency is performed within the current hopping-up interval or the current hopping-down interval. Particularly, a central frequency of the current hopping-up interval or the current hopping-down interval is obtained, and a new hopping-up interval and a new hopping-down interval between two endpoints of the current hopping-up interval or the current hopping-down interval and the corresponding central frequency are formed.

Particularly if the hop is made to the hopping-up interval to further search for the resonant frequency, then the central frequency of the hopping-up interval is obtained, and the new hopping-up interval and the new hopping-down interval are formed between the two endpoints of the current hopping-up interval (i.e., the maximum operating frequency and the preset driving frequency) and the corresponding central frequency.

Still furthermore, if the hop is made to the hopping-up interval to further search for the resonant frequency, then the new hopping-up interval is formed between the central frequency of the original hopping-up interval and the higher one of the two endpoints of the original hopping-up interval, that is, two endpoints of the new hopping-up interval are the maximum operating frequency and the central frequency respectively; and the new hopping-down interval is formed between the central frequency and the lower one of the two endpoints, that is, two endpoints of the new hopping-down interval are the preset driving frequency and the central frequency respectively.

Correspondingly, if the hop is made to the hopping-down interval to further search for the resonant frequency, then the central frequency of the hopping-down interval is obtained, and the new hopping-up interval and the new hopping-down interval are formed between the two endpoints of the current hopping-down interval (i.e., the minimum operating frequency and the preset driving frequency) and the corresponding central frequency.

Still furthermore, if the hop is made to the hopping-down interval to further search for the resonant frequency, then the new hopping-up interval is formed between the central frequency of the original hopping-up interval and the higher one of the two endpoints of the original hopping-up interval, that is, two endpoints of the new hopping-up interval are the preset driving frequency and the central frequency respectively; and the new hopping-down interval is formed between the central frequency and the lower one of the two endpoints, that is, two endpoints of the new hopping-down interval are the central frequency and the minimum operating frequency respectively.

The frequency output control unit connected with the hopping interval generating unit and the transducer is configured to excite the transducer with the central frequency of the current hopping-up interval or the hopping-down interval so that the transducer operates at the central frequency.

The phase acquiring unit connected with the phase determining unit and the transducer is configured to obtain the current phase and the voltage phase of the transducer operating at the central frequency of the current hopping-up interval or the current hopping-down interval, and to output the obtained current phase and voltage phase to the phase determining unit so that the phase determining unit makes the determination.

The resonant frequency obtaining unit connected with the phase determining unit is configured to obtain a frequency of the transducer with the current phase being in phase with the voltage as the resonant frequency upon reception of the third result output by the phase determining unit. The resonant frequency obtained by the resonant frequency obtaining unit can be displayed by the display unit.

Sixth Embodiment

In order to perform the method according to the third embodiment, the invention further provides a system for searching for a resonant frequency of a transducer, and for details of a schematic structural diagram thereof, reference can be made to the schematic structural diagram of the system for searching for a resonant frequency of a transducer according to the fourth embodiment above except for some functional differences of the units The system for searching for a resonant frequency of a transducer according to the embodiment of the invention particularly includes: an initializing unit, a phase determining unit, an interval hopping control unit, a hopping interval generating unit, a frequency output control unit, a phase acquiring unit, a resonant frequency obtaining unit, an input unit, and a display unit.

The initializing unit is configured to perform the following initialization work: obtaining a minimum operating frequency and a maximum operating frequency allowed for the transducer; setting a preset driving frequency, forming a hopping-up interval between the maximum operating frequency and the preset driving frequency, and forming a hopping-down interval between the preset driving frequency and the minimum operating frequency; and obtaining a current phase and a voltage phase of the transducer operating at the preset driving frequency.

In this embodiment, the initializing unit particularly includes a frequency obtaining sub-unit, a driving frequency presetting sub-unit, an initial hopping interval generating sub-unit, a preset frequency output sub-unit, and an initial phase acquiring sub-unit.

The frequency obtaining sub-unit is configured to obtain the minimum operating frequency and the maximum operating frequency allowed for the transducer, where the minimum operating frequency and the maximum operating frequency allowed for the transducer can be known from a description of a specification or a related technical document for the transducer being shipped from a manufactory. Typically there are substantially the same minimum operating frequency and maximum operating frequency specified and required for a batch of transducers being shipped from the manufactory.

Particularly, the minimum operating frequency, the maximum operating frequency, and the preset driving frequency can be input to the initializing unit through the input unit. The input unit includes a keyboard, an input box, etc.

The content input by the input unit can be displayed by the display unit.

The driving frequency presetting sub-unit is configured to set a preset driving frequency. If the particular resonant frequency is unknown, then a resonant frequency can be preset empirically by collecting frequencies for processing. This preset driving frequency shall lie between the minimum operating frequency and the maximum operating frequency allowed for the transducer.

Particularly in this embodiment, the preset driving frequency can further lie in or around the middle between the minimum operating frequency and the maximum operating frequency allowed for the transducer.

The initial hopping interval generating sub-unit connected with the frequency obtaining sub-unit and the driving frequency presetting sub-unit is configured to form the hopping-up interval between the maximum operating frequency and the preset driving frequency, and to form the hopping-down interval between the preset driving frequency and the minimum operating frequency.

The two intervals are formed with the preset driving frequency being a boundary after the minimum operating frequency and the maximum operating frequency allowed for the transducer, and the preset driving frequency are obtained. Particularly the hopping-up interval is formed between the maximum operating frequency and the preset driving frequency, that is, two endpoints of the hopping-up interval are the maximum operating frequency and the preset driving frequency respectively; and the hopping-down interval is formed between the preset driving frequency and the minimum operating frequency, that is, two endpoints of the hopping-down interval are the preset driving frequency and the minimum operating frequency.

The preset frequency output sub-unit is configured to excite the transducer with the preset driving frequency so that the transducer operates at the preset driving frequency.

The initial phase acquiring sub-unit is configured to obtain the current phase and the voltage phase of the transducer operating at the preset driving frequency.

The phase determining unit connected with the initializing unit is configured, when the amount of all the preset driving frequencies does not reach a preset number and the difference in phase between the current and the voltage does not lie in a pre-defined range, or when the amount of all the preset driving frequencies does not reach the preset number and the amplitude of the current does not reach a pre-defined amplitude, if the current leads the voltage in phase, to output a first result, or if the current lags the voltage in phase, to output a second result; when the amount of all the preset driving frequencies reaches the preset number, or when the difference in phase between the current and the voltage lies in the pre-defined range, and the amplitude of the current reaches the pre-defined amplitude, to output a third result;

Particularly the preset amount is a preset search times, which can be preset reasonably from experimental data; the pre-defined amplitude shall be no less than the minimum current amplitude for the transducer to operate normally as technically required; and there is only a value of 0 in the pre-defined range, or the pre-defined range can also be a phase difference range including 0.

Particularly in this embodiment, after the transducer operates at the preset driving frequency, and the current phase and the voltage phase of the transducer operating at the preset driving frequency are acquired or measured, the phase determining unit is configured to determine the leading or lagging relationship between the current phase and the voltage phase, or if the current leads the voltage in phase, to determine that there is a capacitive load, which indicates that the current frequency of the transducer is lower, and the resonant frequency shall be higher than the current frequency of the transducer, so when the amount of all the preset driving frequencies does not reach the preset number and the difference in phase between the current and the voltage does not lie in the pre-defined range, or when the amount of all the preset driving frequencies does not reach the preset number and the amplitude of the current does not reach the pre-defined amplitude, further searching shall be performed within the hopping-up interval, to output the first result indicating that the hop shall be made to the hopping-up interval for a further search; and on the contrary, if the voltage leads the current in phase, to determine that there is an inductive load, which indicates that the current frequency of the transducer is higher, and the resonant frequency shall be lower than the current frequency of the transducer, so when the amount of all the preset driving frequencies does not reach the preset number and the difference in phase between the current and the voltage does not lie in the pre-defined range, or when the amount of all the preset driving frequencies does not reach the preset number and the amplitude of the current does not reach the pre-defined amplitude, further searching shall be performed within the hopping-down interval, to output the second result indicating that the hop shall be made to the hopping-down interval for a further search. Apparently the search range can be narrowed in this search method.

When the amount of all the preset driving frequencies reaches the preset number, which indicates that the real times of searching reach the preset searching times, the search can be stopped at this time, and the third result can be output indicating the search shall be stopped from being continued.

When the voltage phase is equal to or close to the current phase, and the amplitude of the current reaches the pre-defined amplitude, that is, the difference in phase between the current and the voltage lies in the pre-defined range, and the amplitude of the current reaches the pre-defined amplitude, which indicates that the current frequency of the transducer is the resonant frequency, also the search can be stopped at this time, and the third result can be output indicating the search shall be stopped from being continued.

The interval hopping control unit connected with the phase determining unit is configured to make a hop to the hopping-up interval upon reception of the first result output by the phase determining unit, and to make a hop to the hopping-down interval upon reception of the second result output by the phase determining unit.

The hopping interval generating unit connected with the interval hopping control unit is configured to set a new preset driving frequency in the current hopping-up interval or the current hopping-down interval, and to form a new hopping-up interval and a new hopping-down interval between two endpoints of the current hopping-up interval or the current hopping-down interval and the corresponding new preset driving frequency. In fact, further searching may be performed within the current hopping-up interval or the current hopping-down interval for the resonant frequency.

Particularly a central frequency of the current hopping-up interval or the current hopping-down interval can be obtained as the new preset driving frequency, and the new hopping-up interval and the new hopping-down interval can be formed between the two endpoints of the current hopping-up interval or the current hopping-down interval and the corresponding central frequency; alternatively, any frequency can be obtained in the current hopping-up interval or the current hopping-down interval as the new preset driving frequency, and the new hopping-up interval and the new hopping-down interval can be formed, and preferably the new preset driving frequency can be preset as a function of the difference in phase between the current and the voltage currently of the transducer so that the new preset driving frequency is preset farther from the current preset driving frequency if the difference in phase between the current and the voltage of the transducer is larger, and the new preset driving frequency is preset closer to the current preset driving frequency if the difference in phase between the current and the voltage of the transducer is smaller.

Particularly, if the hop is made to the hopping-up interval to further search for the resonant frequency, then a central frequency of the hopping-up interval can be obtained as the new preset driving frequency, and the new hopping-up interval and the new hopping-down interval can be formed between the two endpoints of the current hopping-up interval and the central frequency; or another frequency than the central frequency in the hopping-up interval can be obtained as the new preset driving frequency, and the new hopping-up interval and the new hopping-down interval can be formed between the two endpoints of the current hopping-up interval and the another frequency than the central frequency.

Still furthermore, if the hop is made to the hopping-up interval to further search for the resonant frequency, then the new hopping-up interval is formed between the new preset driving frequency and the higher one of the two endpoints of the original hopping-up interval; and the new hopping-down interval is formed between the new preset driving frequency and the lower one of the two endpoints.

Correspondingly, if the hop is made to the hopping-down interval to further search for the resonant frequency, then a central frequency of the hopping-down interval can be obtained as the new preset driving frequency, and the new hopping-up interval and the new hopping-down interval can be formed between the two endpoints of the current hopping-down interval and the central frequency; or another frequency than the central frequency in the hopping-down interval can be obtained as the new preset driving frequency, and the new hopping-up interval and the new hopping-down interval can be formed between the two endpoints of the current hopping-down interval and the another frequency than the central frequency.

Still furthermore, if the hop is made to the hopping-down interval to further search for the resonant frequency, then the new hopping-up interval is formed between the new preset driving frequency and the higher one of the two endpoints of the original hopping-down interval; and the new hopping-down interval is formed between the new preset driving frequency and the lower one of the two endpoints.

The frequency output control unit connected with the hopping interval generating unit and the transducer is configured to excite the transducer with the new preset driving frequency in the current hopping-up interval or the hopping-down interval so that the transducer operates at the new preset driving frequency.

The phase acquiring unit connected with the phase determining unit and the transducer is configured to obtain a current phase and a voltage phase of the transducer operating at the new preset driving frequency in the current hopping-up interval or the current hopping-down interval, and to output the obtained current phase and voltage phase to the phase determining unit so that the phase determining unit makes the determination.

The resonant frequency obtaining unit connected with the phase determining unit is configured to obtain a frequency of the transducer with the amplitude of the current being the largest as the resonant frequency upon reception of the third result output by the phase determining unit when the amount of all the preset driving frequencies reaches the preset number, and to obtain a frequency of the transducer with the difference in phase between the current and the voltage lying in the pre-defined range, and the amplitude of the current reaching the pre-defined amplitude upon reception of the third result output by the phase determining unit when the difference in phase between the current and the voltage lies in the pre-defined range, and the amplitude of the current reaches the pre-defined amplitude.

In fact, the system for searching for a resonant frequency of a transducer according to the invention also sets a new preset driving frequency continuously in the original hopping-up interval or the original hopping-down interval, forms two new corresponding hopping-up interval and hopping-down interval respectively, and then determines the relationship between the current phase and the voltage phase, and determines one of the intervals for the next search, so that the search range of the interval for the last search can be narrowed by at least half thereof in each frequency hopping. That is, the resonant frequency can be found after a number $[\log_2^n]$ of searches, where n represents the difference between the minimum operating frequency and the maximum operating frequency allowed for the transducer. Apparently the search system according to the invention between the frequency hopping can greatly lower the number of searches and also can shorten the operating period of time and lower the rise in temperature of the transducer to thereby improve the accuracy of the search for the resonant frequency, lower in effect the number of times that the transducer operates uselessly, improve the utilization ratio and lifetime of the transducer, and also lower the cost thereof in use. Moreover the invention can be supplemented with a function of detecting in real time the operating state of the transducer due to the short search period of time.

Seventh Embodiment

In order to enable those skilled in the art to further understand the method for searching for a resonant frequency of a transducer according to the invention, the principle and the implementation of the method for searching for a resonant frequency of a transducer according to the invention will be described below in further details. In this particular embodiment, a central frequency of the current hopping-up interval or the current hopping-down interval is obtained as a new preset driving frequency set each time.

It is assumed that resonant frequencies of certain batch of transducers shipped from a manufactory range from 50,000 Hz to 60,000 Hz, that is, the maximum operating frequency is 60,000 Hz, and the minimum operating frequency is 50,000 Hz.

A preset driving frequency is a central frequency in the range, i.e., 55,000 Hz, that is, a hopping-up interval ranges from 55,000 Hz to 60,000 Hz, and a hopping-down interval ranges from 50,000 Hz to 55,000 Hz.

At this time it is assumed that the current leading the voltage in phase is detected, and a hop shall be made to the hopping-up interval, that is, a first frequency hopping is made to the interval ranging from 55,000 Hz to 60,000 Hz.

Then a preset driving frequency is a central frequency in the hopping-up interval, i.e., 57,500 Hz, and a new hopping-down interval ranges from 55,000 Hz to 57,500 Hz, and a new hopping-up interval ranges from 57,500 Hz to 60,000 Hz.

At this time it is assumed that the voltage leading the current in phase is detected, and a hop shall be made to the hopping-down interval, that is, a second frequency hopping is made to the interval ranging from 55,000 Hz to 57,500 Hz.

Thereafter the two operations above are repeated, so that a preset driving frequency is a central frequency of the hopping-down interval, i.e., 56,250 Hz, and a new hopping-up interval ranges from 56,250 Hz to 57,500 Hz, and a new hopping-down interval ranges from 55,000 Hz to 56,250 Hz.

The same process will be repeated until the voltage and the current are in phase with each other, and the frequency hopping is stopped, where the output frequency of the transducer is the resonant frequency.

In the prior art, sweeping is performed from 50,000 Hz to 60,000 Hz, and a period of time with 10,000 determinations may be required for the accuracy of the search result; and in the method for searching for a resonant frequency of a transducer according to the invention, it can be calculated that the resonant frequency can be found as a result of at most $\log_2^{1000} \approx 14$ searches in the resonance point range spanning 10,000 Hz, so the search efficiency can be improved by a factor of 99.9% to thereby greatly shorten the period of time for awaiting the detection.

In summary, as described above, a method and system for searching for a resonant frequency of a transducer according to the invention can achieve the following advantageous effects:

1. With the search method according to the invention between the frequency hopping, the number of searches can be greatly lowered to the greatest extent from original 10,000 searches down to 14 searches, so the search efficiency can be improved by a factor of 99.9% to thereby greatly shorten the period of time for awaiting the detection for the resonant frequency of the transducer.

2. The invention can greatly shorten the search period of time and also shorten the operating period of time and lower the rise in temperature of the transducer to thereby improve the accuracy of the search for the resonant frequency.

3. The invention can lower in effect the number of times that the transducer operates uselessly, improve the utilization ratio and lifetime of the transducer, and also lower the cost thereof in use.

4. In the invention, there is such a short search period of time that the function of detecting in real time the operating state of the transducer can be added.

Thus the invention can overcome in effect the numerous drawbacks in the prior art and provide a high value of use in the industry.

The embodiments above are merely illustrative of the principle and the effects of the invention but not intended to limit the invention. Those skilled in the art can make variations or modifications to the embodiments above without departing from the spirit and scope of the invention. Accordingly any equivalent variations or modifications made by those skilled in the art with general knowledge, without departing from the spirit and scope of the invention, shall be encompassed in the claims of the invention.

The invention claimed is:

1. A system for searching for a resonant frequency of a transducer, comprising at least one processor and a memory, wherein the memory is configured to store computer readable program codes, the at least one processor is configured to execute the computer readable program codes:

to determine a current searching interval for searching for the resonant frequency of the transducer, and to set a preset driving frequency in the current searching interval;

to determine a hopping-up interval and a hopping-down interval according to the preset driving frequency and two endpoints of the current searching interval;

to obtain a current phase and a voltage phase of the transducer operating at the preset driving frequency, and to determine whether a difference in phase between a current and a voltage lies in a pre-defined range;

to hop to the hopping-up interval or the hopping-down interval according to a relationship between the current phase and the voltage phase and to take the hopping-up interval or the hopping-down interval as a new searching interval for the resonant frequency if the difference in phase between the current and the voltage does not lie in the pre-defined range; and to obtain a frequency of the transducer with the difference in phase between the current and the voltage lying in the pre-defined range as the resonant frequency if the difference in phase between the current and the voltage lies in a pre-defined range;

wherein the at least one processor is further configured to execute the computer readable program codes:

to hop to the hopping-up interval and taking the hopping-up interval as the new searching interval for the resonant frequency if the current leads the voltage in phase; or to hop to the hopping-down interval, and taking the hopping-down interval as the new searching interval for the resonant frequency if the current lags the voltage in phase.

2. The system for searching for a resonant frequency of a transducer according to claim 1, wherein if the current searching interval is an initial searching interval, then the two endpoints of the initial searching interval are a minimum operating frequency and a maximum operating frequency allowed for the transducer, respectively.

3. The system for searching for a resonant frequency of a transducer according to claim 1, wherein the preset driving frequency is a central frequency within the current searching interval.

4. The system for searching for a resonant frequency of a transducer according to claim 1, wherein the at least one processor is further configured to execute the computer readable program codes:

to determine the hopping-up interval according to the preset driving frequency and a higher one of the two endpoints; and to determine the hopping-down interval according to the preset driving frequency and a lower one of the two endpoints.

5. The system for searching for a resonant frequency of a transducer according to claim 1, wherein the difference in phase between the current and the voltage does not lie within a pre-defined range refers to that the difference in phase therebetween is not zero; and the difference phase the current and the voltage lies within the pre-defined range refers to that the difference in phase therebetween is zero.

6. A method for searching for a resonant frequency of a transducer, applied in a system for searching for a resonant frequency of a transducer according to claim 1, comprising:

determining a current searching interval for searching for the resonant frequency of the transducer, and setting a preset driving frequency in the current searching interval;

determining a hopping-up interval and a hopping-down interval according to the preset driving frequency and two endpoints of the current searching interval;

obtaining a current phase and a voltage phase of the transducer operating at the preset driving frequency, and determining whether a preset condition is satisfied; and hopping to the hopping-up interval or the hopping-down interval according to a relationship between the current phase and the voltage phase and taking the hopping-up interval or the hopping-down interval as a new searching interval for the resonant frequency if preset condition is not satisfied, or obtaining a corresponding frequency of the transducer as the resonant frequency if the preset condition is satisfied.

7. The method for searching for a resonant frequency of a transducer according to claim 6, wherein if the current searching interval is an initial searching interval, then the two endpoints of the initial searching interval are a minimum operating frequency and a maximum operating frequency allowed for the transducer, respectively.

8. The method for searching for a resonant frequency of a transducer according to claim 6, wherein the preset driving frequency is a central frequency within the current searching interval.

9. The method for searching for a resonant frequency of a transducer according to claim 6, wherein determining the hopping-up interval and the hopping-down interval according to the preset driving frequency and two endpoints of the current searching interval comprising:

determining the hopping-up interval according to the preset driving frequency and a higher one of the two endpoints; and determining the hopping-down interval according to the preset driving frequency and a lower one of the two endpoints.

10. The method for searching for a resonant frequency of a transducer according to claim 6, wherein:

hopping to the hopping-up interval or the hopping-down interval according to a relationship between the current phase and the voltage phase and taking the hopping-up interval or the hopping-down interval as a new searching interval for the resonant frequency, if the preset condition is not satisfied comprising:

hopping to the hopping-up interval or the hopping-down interval according to a relationship between the current phase and the voltage phase and taking the hopping-up interval or the hopping-down interval as the new searching interval for the resonant frequency, if a difference in phase between a current and a voltage does not lie in the pre-defined range; and obtaining a corresponding frequency of the transducer as the resonant frequency if the preset condition is satisfied, comprising:

obtaining a frequency of the transducer with the difference in phase between the current and the voltage lying in the pre-defined range as the resonant frequency, if a difference in phase between a current and a voltage lies in a pre-defined range.

11. The method for searching for a resonant frequency of a transducer according to claim 10, wherein hopping to the hopping-up interval or the hopping-down interval according to a relationship between the current phase and the voltage phase and taking the hopping-up interval or the hopping-down interval as the new searching interval for the resonant frequency comprising:

if the current leads the voltage in phase, then hopping to the hopping-up interval and taking the hopping-up interval as the new searching interval for the resonant frequency; or if the current lags the voltage in phase, then hopping to the hopping-down interval, and taking the hopping-down interval as the new searching interval for the resonant frequency.

12. The method for searching for a resonant frequency of a transducer according to claim 10, wherein the difference in phase between the current and the voltage does not lie within a pre-defined range refers to that the difference in phase therebetween is not zero; and the difference phase the current and the voltage lies within the pre-defined range refers to that the difference in phase therebetween is zero.

13. A system for searching for a resonant frequency of a transducer, comprising at least one processor and a memory, wherein the memory is configured to store computer readable program codes, the at least one processor is configured to execute the computer readable program codes:
- to determine a current searching interval for searching for the resonant frequency of the transducer, and to set a preset driving frequency in the current searching interval;
- to determine a hopping-up interval and a hopping-down interval according to the preset driving frequency and two endpoints of the current searching interval;
- to obtain a current phase and a voltage phase of the transducer operating at the preset driving frequency, and to determine whether a number of times of setting the preset driving frequency reaches a preset number, and to determine whether a difference in phase between a current and a voltage lies in a pre-defined range, and to determine whether an amplitude of the current reaches a pre-defined amplitude;
- to hop to the hopping-up interval or the hopping-down interval according to a relationship between the current phase and the voltage phase and to take the hopping-up interval or the hopping-down interval as the new searching interval for the resonant frequency, when the number of times of setting the preset driving frequency does not reach the preset number and the difference in phase between the current and the voltage does not lie in the pre-defined range, or when the number of times of setting the preset driving frequency does not reach the preset number and the amplitude of the current does not reach the pre-defined amplitude; and
- to obtain a frequency of the transducer with a largest amplitude of current as the resonant frequency when the number of times of setting the preset driving frequency reaches the preset number; or to obtain a frequency as the resonant frequency at which the difference in phase between the current and the voltage of the transducer lies in the pre-defined range, and the amplitude of the current reaches the pre-defined amplitude wherein the at least one processor is further configured to execute the computer readable program codes:
- to hop to the hopping-up interval and taking the hopping-up interval as the new searching interval for the resonant frequency if the current leads the voltage in phase; or
- to hop to the hopping-down interval, and taking the hopping-down interval as the new searching interval for the resonant frequency if the current lags the voltage in phase.

14. The system for searching for a resonant frequency of a transducer according to claim 13, wherein the difference in phase between the current and the voltage does not lie within a pre-defined range refers to that the difference in phase therebetween is not zero; and the difference phase the current and the voltage lies within the pre-defined range refers to that the difference in phase therebetween is zero.

* * * * *